United States Patent
Watanabe et al.

(10) Patent No.: US 7,388,268 B2
(45) Date of Patent: Jun. 17, 2008

(54) COMPOUND SEMICONDUCTOR MULTILAYER STRUCTURE, HALL DEVICE, AND HALL DEVICE MANUFACTURING METHOD

(75) Inventors: Takayuki Watanabe, Fuji (JP); Yoshihiko Shibata, Fuji (JP); Tsuyoshi Ujihara, Fuji (JP); Takashi Yoshida, Fuji (JP); Akihiko Oyama, Numazu (JP)

(73) Assignee: Asahi Kasei Electronics Co., Ltd., Tokyo (JP)

(*) Notice: Subject to any disclaimer, the term of this patent is extended or adjusted under 35 U.S.C. 154(b) by 159 days.

(21) Appl. No.: 10/501,349

(22) PCT Filed: Jan. 15, 2003

(86) PCT No.: PCT/JP03/00291

§ 371 (c)(1),
(2), (4) Date: Jul. 15, 2004

(87) PCT Pub. No.: WO03/061025

PCT Pub. Date: Jul. 24, 2003

(65) Prior Publication Data

US 2005/0042814 A1 Feb. 24, 2005

(30) Foreign Application Priority Data

Jan. 15, 2002 (JP) ............................. 2002-006670

(51) Int. Cl.
*H01L 43/00* (2006.01)
*H01L 3/0328* (2006.01)

(52) U.S. Cl. ............................. 257/425; 257/E43.003; 257/E43.004; 257/425; 257/536; 438/779

(58) Field of Classification Search ................ 257/421, 257/422, 423, 424, 425, 427
See application file for complete search history.

(56) References Cited

U.S. PATENT DOCUMENTS 4,195,305 A * 3/1980 Moon .......................... 257/191

(Continued)

FOREIGN PATENT DOCUMENTS

EP 0 548 375 A1 6/1993

(Continued)

OTHER PUBLICATIONS

Office Action in U.S. Appl. No. 09/762,327 dated Jul. 25, 2002.

(Continued)

*Primary Examiner*—Steven Loke
*Assistant Examiner*—David Goodwin
(74) *Attorney, Agent, or Firm*—Finnegan, Henderson, Farabow, Garrett & Dunner, LLP

(57) ABSTRACT

Hall device is provided by enabling stable provision of a quantum well compound semiconductor stacked structure. It has first and second compound semiconductor layers composed of Sb and at least two of five elements of Al, Ga, In, As and P, and an active layer composed of $In_xGa_{1-x}As_ySb_{1-y}$ ($0.8 \leq x \leq 1.0$, $0.8 \leq y \leq 1.0$), which are stacked. Compared with the active layer, the first and second compound semiconductor layers each have a wider band gap, and a resistance value five times or more greater. The lattice constant differences between the active layer and the first and second compound semiconductor layers are each designed in a range of 0.0-1.2%, and the thickness of the active layer is designed in a range of 30-100 nm.

16 Claims, 24 Drawing Sheets

U.S. PATENT DOCUMENTS

| | | | |
|---|---|---|---|
| 4,236,165 A * | 11/1980 | Kawashima et al. ............ 257/1 |
| 4,668,100 A | 5/1987 | Murakami et al. |
| 4,690,714 A * | 9/1987 | Li ................................ 438/24 |
| 5,184,106 A * | 2/1993 | Partin et al. ............... 338/32 R |
| 5,198,795 A | 3/1993 | Shibasaki et al. |
| 5,385,864 A * | 1/1995 | Kawasaki et al. ............. 438/48 |
| 5,430,310 A | 7/1995 | Shibasaki et al. |
| 5,453,727 A * | 9/1995 | Shibasaki et al. ......... 338/32 R |
| 5,491,461 A * | 2/1996 | Partin et al. ............... 338/32 R |
| 5,621,320 A | 4/1997 | Yokotani et al. |
| 5,804,475 A * | 9/1998 | Meyer et al. ................ 438/172 |
| 5,883,564 A * | 3/1999 | Partin ....................... 338/32 R |
| 6,100,546 A * | 8/2000 | Major et al. ................ 257/103 |
| 6,590,389 B1 * | 7/2003 | Shibasaki et al. ........... 324/252 |
| 6,630,882 B1 * | 10/2003 | Heremans et al. ........ 338/32 H |
| 6,809,514 B2 * | 10/2004 | Ashley et al. .............. 324/251 |
| 6,861,679 B2 * | 3/2005 | Otsuka et al. .............. 257/194 |
| 2001/0055002 A1 | 12/2001 | Endo |
| 2002/0009192 A1 | 1/2002 | Nakamura |

FOREIGN PATENT DOCUMENTS

| | | |
|---|---|---|
| EP | 0 810 544 A2 | 12/1997 |
| EP | 1 124 271 A1 | 8/2001 |
| JP | 59-048970 | 3/1984 |
| JP | 02-272782 | 11/1990 |
| JP | 03-288483 | 12/1991 |
| JP | 05-297084 | 11/1993 |
| JP | 06-077556 | 3/1994 |
| JP | 06-77556 | 3/1994 |
| JP | 06-125122 | 5/1994 |
| JP | 06-224488 | 8/1994 |
| JP | 07-283390 | 10/1995 |
| JP | 08-88423 | 4/1996 |
| JP | 08-088423 | 4/1996 |
| JP | 08-204251 | 8/1996 |
| JP | 08-242027 | 9/1996 |
| JP | 09-116207 | 5/1997 |
| JP | 09-203748 | 8/1997 |
| JP | 09-219547 | 8/1997 |
| JP | 10-233539 | 2/1998 |
| JP | 10-074308 | 3/1998 |
| JP | 2793440 | 6/1998 |
| JP | P3069545 | 5/2000 |
| JP | 2000-183424 | 6/2000 |
| JP | 2001-352369 | 12/2001 |
| KR | 20010058109 | 5/2001 |
| WO | WO-00/08695 | 2/2000 |

OTHER PUBLICATIONS

N. Kuze et al., "Molecule beam epitaxial growth of InAs/AlGaAsSb deep quantum well structures on GaAs substrates," J. Vac. Sci. Technol. B 16(5), Sep./Oct. 1998, American Vacuum Society, pp. 2644-2649.

European Search Report and Communication for European Patent Application No. 07008331.6, dated Jul. 3, 2007.

European Supplementary Search Report for European Patent Application No. 03700583.2 dated Jun. 18, 2007.

* cited by examiner

COMPOUND SEMICONDUCTOR MULTILAYER STRUCTURE, HALL DEVICE, AND HALL DEVICE MANUFACTURING METHOD

TECHNICAL FIELD

The present invention relates to a compound semiconductor stacked structure and a compound semiconductor Hall device using the structure, and their fabrication method. More specifically, the present invention relates to a stacked compound semiconductor Hall device with an active layer of InAs or the like, and aims to provide a highly sensitive, low power consumption magnetic sensor with excellent temperature characteristics using a stacked structure, which is a quantum well compound semiconductor stacked structure with high electron mobility and sheet resistance, and excellent temperature characteristics.

In addition, the present invention relates to various devices for mobile equipment using the Hall device.

BACKGROUND ART

Generally, Hall devices are used for the rotation control and position detection of motors and for magnetic field detection, and find extensive application in such fields as brushless motor, noncontact open/close detection switch, and current sensor.

Recently, mobile equipment typified by mobile phones, mobile information terminals and notebook personal computers has become widely available. The Hall devices are widely applied not only to such devices that are installed into the mobile equipment, but also to technical fields of automobiles and the like.

For example, the Hall device is used as a pointing device for reading an input direction and an amount of movement by detecting the movement of a magnet mounted on an input portion. This pointing device has an advantage over a button pointing device whose input information is only a direction in that it can input more detailed information including both the direction and amount of movement.

Furthermore, the Hall device is also applicable as a sensor used for an open/close detection switch of a flap attached to the mobile equipment. The sensor includes a magnet placed at one of the body and flap, and a Hall device placed at the other of them, and detects the opening and closing according to the variations in the magnetic field involved in the movement of the magnet. The open/close detection switch using the Hall device has an advantage over open/close detection switches with contacts such as a reed switch in that its life is semipermanent.

Moreover, the Hall device is also used for a geomagnetic direction sensor.

Basic characteristics required of the Hall device used for the mobile equipment are low power consumption, high sensitivity, and good temperature characteristics. The low power consumption is the most important characteristics of the mobile equipment with a battery.

As for the sensitivity, the higher sensitivity makes it possible to detect smaller variations in the magnetic field, thereby increasing flexibility in placing the magnet and Hall device, and in selecting the type of the magnet. As for the temperature characteristics, the better temperature characteristics makes it possible to achieve better accuracy without adding any extra function to the circuit such as that for temperature correction, thereby simplifying the circuit design and reducing the cost.

In such technical fields, magnetic sensors with low power consumption, high sensitivity and excellent temperature characteristics are required. In particular, it is very important for the mobile equipment such as mobile phones to have low power consumption.

Generally, the major characteristics of the Hall device constituting the magnetic sensor depend greatly on the characteristics of the semiconductor material. For example, the sensitivity is proportional to the electron mobility of the semiconductor material, and the power consumption, which is inversely proportional to the input resistance of the device, becomes smaller as the sheet resistance of the semiconductor material increases.

The conventional Hall devices use compound semiconductors with large electron mobility, particularly such as InAs, InSb and GaAs. This is because the InAs, InSb and GaAs and their compound semiconductors have high electron mobility, and are suitable as a material for the highly sensitive Hall devices. Although the Hall devices using the InSb or InAs have good sensitivity, they have a problem of being inferior in the temperature characteristics and power consumption characteristics. It is known that the temperature characteristics of the Hall devices can be improved by doping Si into InAs. However, they cannot satisfy other device characteristics such as the sensitivity characteristics and power consumption characteristics. In contrast, although the Hall devices using the GaAs as the material have good temperature characteristics and power consumption characteristics, they have a problem in that their sensitivity is low.

Thus, no Hall devices are applied easily to the mobile equipment. Accordingly it is necessary to use the Hall devices with various of contrivances.

As for these problems, Japanese Patent No. 3069545 discloses a stacked structure having a first compound semiconductor layer, an InAs layer formed thereon as an active layer, and a second compound semiconductor layer with a high resistance formed on the top surface of the InAs layer. It forms a quantum well potential in the InAs active layer, increases the mobility of the electrons passing through the active layer and the sheet resistance because of the appearance of the quantum effect, thereby being able to form a stacked structure with good temperature characteristics.

Japanese Patent No. 2793440 (Japanese Patent Application Laid-open No. 6-077556 (1994) discloses that a high electron mobility, large input resistance and excellent temperature characteristic Hall device can be formed by forming an InAs active layer on an AlGaAsSb layer that has a lattice constant close to that of the InAs active layer and a large band gap.

In addition, J. Vac. Sci. Technol. B16(1998) p. 2644 discloses a structure achieving higher electron mobility by forming an AlGaAsSb layer on InAs, with a structure sandwiching an InAs active layer with compound semiconductor layers with a large band gap.

As a technique concerning the device structure of the Hall device that sandwiches the InAs active layer with the AlGaAsSb layers, there is Japanese Patent Application Laid-open No. 9-116207 (1997), for example. It describes that the reliability is improved by removing all the semiconductor thin films other than a magneto-sensitive pattern, and by covering the entire magneto-sensitive pattern and electrode layer with a passivation. It also describes that the electrode layer may make contact either with the InAs layer or with the upper AlGaAsSb layer.

However, to bring the sensitivity and resistance value of the Hall devices employing such a compound semiconductor stacked structure into specified design ranges, it is necessary to place the electron mobility and sheet resistance value of the compound semiconductor material within certain ranges with high reproducibility. However, since it is difficult to control their physical property values, a problem arises in that it is difficult to manufacture the Hall devices with the quantum well compound semiconductor stacked structure industrially.

In addition, the foregoing Hall device has a problem in that the absolute value of an unbalanced voltage (Vu) does not agree with that of a rotated unbalanced voltage (rVu) obtained by rotating the input and output terminals by 90°. In a linear Hall IC used as a current sensor, an output voltage obtained by the 90° rotation is added to cancel out the Vu, thereby achieving good linearity of the Hall output for the magnetic field. It is desirable that the absolute value of the Vu agree with that of the rVu, and the difference between the absolute values of the Vu and rVu must be within 0.5 mV (for a input voltage of 3V) from a practical standpoint. Therefore it is required that the disagreement between the foregoing Vu and rVu (called Vu+rVu variations from now on) be improved.

Furthermore, the foregoing Hall devices have a problem in that their reliability is insufficient. More specifically, the unbalanced voltage (Vu) value varies greatly under high temperature, high moisture conditions, and input resistance (Rin) and unbalanced voltage (Vu) value vary greatly when soldering the Hall device to a printed circuit board.

FIG. 1 is a view showing an example of a Hall device with a structure disclosed in Japanese Patent Application Laid-open No. 9-116207 (1997), and FIG. 2 is a flowchart illustrating its fabrication process. In FIG. 1, the reference numeral 1 designates a substrate, 2 designates semiconductor thin films, 2a designates a first compound semiconductor layer, 2b designates an active layer, 2c designates a second compound semiconductor layer, 2d designates a third compound semiconductor layer, 3 designates a metal electrode layer, and 4 designates a passivation.

The Hall device has the metal electrode layer formed by a lift off method, and is completed by covering the entire device with the passivation, followed by opening a bonding pad section. The reason for using the lift off method for forming the electrodes is that the compound semiconductor including Sb has not enough resistance to acid and alkali, and hence it is difficult to carry out patterning by etching using the acid or alkali after forming the metal electrode layer on the entire surface.

However, the metal electrode layer formed by the lift off method has a problem of leaving protruding, ragged edges (burrs) at the edges of the patterns, thereby greatly deteriorating the covering conditions of the passivation formed thereon. As a result, a high temperature, high moisture accelerated test results in corrosion of the compound semiconductor including Sb with insufficient moisture resistance, thereby varying the unbalanced voltage Vu greatly.

Because of these variations, the conventional Hall devices are not practical. Thus, the Hall devices are required with small characteristic variations under the high temperature, high moisture conditions and due to soldering, that is, with a high reliability.

The present invention is implemented to solve the foregoing problems. Therefore it is an object of the present invention to ensure a stable supply of a stacked structure of a quantum well compound semiconductor with high electron mobility and sheet resistance and with excellent temperature characteristics by improving the reproducibility of controlling the physical properties of the quantum well compound semiconductor stacked structure, thereby enabling industrial provision of highly sensitive, low power consumption Hall devices with excellent temperature characteristics.

Another object of the present invention is to provide a compound semiconductor Hall device with small Vu+rVu variations in the stacked compound semiconductor Hall device capable of achieving high sensitivity using InAs or the like as an active layer.

Still another object of the present invention to provide a highly reliable compound semiconductor Hall device and its fabrication method in the stacked compound semiconductor Hall device capable of achieving high sensitivity using InAs or the like as an active layer.

Still another object of the present invention to provide a magnetic sensor suitable for various devices used for the mobile equipment such as pointing devices.

DISCLOSURE OF THE INVENTION

To fabricate a low power consumption, highly sensitive Hall device, a high resistance, high mobility semiconductor thin film is required. In addition, to implement a Hall device with good temperature characteristics, it is necessary to select as the active layer a semiconductor having desired temperature characteristics in an operating temperature range of the Hall device rather than to select a semiconductor film with a narrow band gap such as InSb in the operating temperature range.

Generally, the sensitivity and the temperature characteristics are mutually contradictory. Consequently, to fabricate a high resistance, highly sensitive Hall device with good temperature characteristics, it is necessary to select a semiconductor with good temperature characteristics, and to form a thin active layer with good crystallinity as much as possible.

The Hall devices up to now have a problem in that the thin active layers bring about degradation in the crystallinity and reduction in the mobility. This is because since the active layers are formed immediately on the substrates, large mismatching occurs between crystal lattice spacings in the substrates and the active layers.

To implement both the high resistance and high mobility characteristics, it is necessary to ease the lattice mismatch between the substrate and the active layer by providing the active layer with such a multilayer structure that sandwiches buffer layers that have a lattice constant close to that of the active layer and has a high resistance. The multilayer structure allows the active layer to be reduced in thickness with maintaining the crystallinity.

Forming the magneto-sensitive pattern with such a multilayer structure film makes it possible to fabricate an ideal Hall device with such characteristics suitable for mobile equipment as high resistance, high sensitivity, and good temperature characteristics that have not been achieved up to now. Applying such a Hall device to the mobile equipment can facilitate the design of the equipment.

The inventors of the present invention disclose that the Vu+rVu variations increase because very weak currents flow through regions other than the active layer when the compound semiconductor layers with the large band gap, which are placed on and under the active layer, make contact with the metal electrode layer, and the amounts and paths of the currents differ slightly for terminals at four locations. Thus, they found that a device structure, in which all the surfaces (top surface and side surfaces) of the compound semiconductor layers are covered with the passivation, and the metal electrode layer makes contact with only the active layer without making contact with the compound semiconductor layers, is effective to fabricate a Hall device with small Vu+rVu variations.

In addition, the inventors of the present invention disclose that the conventional device structures cannot cover the semiconductor thin films with the passivation completely with good covering, but increases the characteristic variations because of the corrosion of the compound semiconductor layers including Sb susceptible to oxidation by moisture. Thus, they found that covering all the exposed surfaces of the compound semiconductor layer, that is, all the surfaces and side surfaces, directly with a passivation is effective to fabricate the device with small characteristic variations under the high temperature, high moisture conditions.

Furthermore, the inventors of the present invention disclose that the characteristic variations in the device increase in a high temperature (such as soldering) because of the instability of the interface conditions between a cap layer and the passivation, which is caused by damage such as oxidation on the cap layer, that is, on a GaAsSb layer surface, during an $O_2$ ashing step or the like in the Hall device fabrication process. Thus, they found that it is effective for stabilizing the interface conditions between the cap layer and the passivation for fabricating the Hall device with high soldering heat resistance, to form the cap layer with InGaAs without containing Sb, and to inhibit the damage on the outermost surface of the semiconductor thin film by forming a passivation after forming the semiconductor thin films, followed by forming a magneto-sensitive pattern using the patterned passivation as a mask.

According to an aspect of the present invention, there is provided a compound semiconductor stacked structure having a first compound semiconductor layer, an active layer, and a second compound semiconductor layer, which are successively stacked on a substrate, wherein the first and second compound semiconductor layers are each a compound semiconductor layer having Sb and at least two of five elements consisting of Al, Ga, In, As and P; the active layer consists of a compound semiconductor with a composition represented by $In_xGa_{1-x}As_ySb_{1-y}$ ($0.8 \leq x \leq 1.0$, $0.8 \leq y \leq 1.0$); the first and second compound semiconductor layers each have a band gap greater than that of the active layer, and a resistance at least five times greater than that of the active layer; lattice constant differences between the active layer and the first and second compound semiconductor layers are set within a range of 0.0 to 1.2%; and the active layer is thicker than 30 nm and thinner than 100 nm.

It is preferable that a third compound semiconductor layer composed of GaAs be stacked on the second compound semiconductor layer.

The compound semiconductor constituting the active layer is InAs.

It is preferable that the first and second compound semiconductor layers are each composed of $Al_zGa_{1-z}As_ySb_{1-y}$ ($0.0 \leq Z \leq 1.0$, $0.0 \leq Y \leq 0.3$).

A magnetic sensor can be constructed by attaching electrodes to the active layer of such a compound semiconductor stacked structure.

Such a magnetic sensor is suitable for mobile equipment, particularly for mobile phones.

According to another aspect of the present invention, there is provided a Hall device comprising: semiconductor thin films including an active layer composed of $In_{X1}Ga_{1-X1}As_{Y1}Sb_{1-Y1}$ ($0 \leq X1 \leq 1$, $0 \leq Y1 \leq 1$), and compound semiconductor layers that are formed on and under the active layer, and that each have a band gap greater than that of the active layer; a metal electrode layer; and a passivation, wherein the metal electrode layer makes contact only with the active layer, and top surfaces and side surfaces of the semiconductor thin films other than the contact surface are directly covered with the passivation.

It is preferable that the compound semiconductor layers be each including Sb.

The Hall device can have a cap layer composed of $In_{X2}Ga_{1-X2}As$ ($0 \leq X2 \leq 1$) on the compound semiconductor layer formed on the active layer.

It is preferable that the semiconductor thin films be formed on a substrate composed of GaAs or Si, the active layer be composed of InAs, and the compound semiconductor layers be each composed of $Al_{Z1}Ga_{1-Z1}As_{Y2}Sb_{1-Y2}$ ($0 \leq Z1 \leq 1$, $0 \leq Y2 \leq 0.3$).

In addition, it is preferable that the Hall device have an active layer consisting of a layer composed of an $In_xGa_{1-x}As_ySb_{1-y}$ ($0 \leq x \leq 1$, $0 \leq y \leq 1$) layer greater than 30 nm and less than 100 nm in film thickness, and have a magneto-sensitive pattern with a multilayer structure including compound semiconductors between which the active layer is sandwiched, and that input resistance R×sensitivity Vh be equal to or greater than 20 [Ω·V] under conditions that an input voltage is 1 V, and applied magnetic field is 50 mT.

It is preferable that the active layer have its upper and lower layers composed of Sb and at least two of five elements of Al, Ga, In, As and P.

Such a Hall device is suitable for a pointing device, an open/close detection switch of a mobile phone, and a geomagnetic direction sensor.

According to still another aspect of the present invention, there is provided a fabrication method of a Hall device comprising the steps of: forming semiconductor thin films including an active layer composed of $In_{X1}Ga_{1-X1}As_{Y1}Sb_{1-Y1}$ ($0 \leq X1 \leq 1$, $0 \leq Y1 \leq 1$), and compound semiconductor layers that are formed on and under the active layer, and that each have a band gap greater than that of the active layer; exposing the active layer by etching the compound semiconductor layers on regions at which a metal electrode layer is to be formed; and forming a passivation subsequently such that it covers the entire semiconductor thin films.

It is preferable that the fabrication method of the Hall device further have the steps of: etching the semiconductor thin films except for a magneto-sensitive pattern and electrode contact regions using the patterned passivation as a mask; and covering with a second passivation the substrate and side surfaces of the semiconductor thin films exposed by the etching step, and the passivation.

According to still another aspect of the present invention, there is provided a fabrication method of a Hall device comprising the steps of: forming semiconductor thin films including an active layer composed of $In_{X1}Ga_{1-X1}As_{Y1}Sb_{1-Y1}$ ($0 \leq X1 \leq 1$, $0 \leq Y1 \leq 1$), and compound semiconductor layers that are formed on and under the active layer, and that each include Sb, and that each have a band gap greater than that of the active layer; forming a first passivation after the step of forming the semiconductor thin films; removing by etching the semiconductor thin films except for a magneto-sensitive pattern and electrode contact regions using the patterned first passivation as a mask; and covering with a second passivation the substrate and the semiconductor thin films exposed by etching, and the first passivation.

According to still another aspect of the present invention, there is provided a fabrication method of a Hall device comprising the steps of: forming semiconductor thin films including an active layer composed of $In_{X1}Ga_{1-X1}As_{Y1}Sb_{1-Y1}$ ($0 \leq X1 \leq 1$, $0 \leq Y1 \leq 1$), and compound semiconductor layers that are formed on and under the active layer, and that each include Sb, and that each have a band gap greater than that of the active layer; forming a first passivation after the step of forming the semiconductor thin films; removing by etching the semiconductor thin films except for a magneto-sensitive pattern and electrode contact regions using the patterned first passivation as a mask; exposing the active layer making contact with the metal electrode layer by removing the first passivation and upper compound semiconductor layer by etching; and covering with a second passivation the substrate and the semiconductor thin films exposed by etching, and the first passivation.

According to still another aspect of the present invention, there is provided fabrication method of a Hall device comprising the steps of: forming semiconductor thin films including an active layer composed of $In_{X1}Ga_{1-X1}As_{Y1}Sb_{1-Y1}$ ($0 \leq X1 \leq 1$, $0 \leq Y1 \leq 1$), and compound semiconductor layers that are formed on and under the active layer, and that each include Sb, and that each have a band gap greater than that of the active layer; forming a first passivation after the step of forming the semiconductor thin films; removing by etching the semiconductor thin films except for a magneto-sensitive pattern and electrode contact regions using the patterned first passivation as a mask; covering with a second passivation the substrate and the semiconductor thin films exposed by etching, and the first passivation; exposing the active layer making contact with the metal electrode layer by removing the first and second passivation and upper compound semiconductor layer by etching; and covering the semiconductor thin films and the second passivation, which are exposed by etching, with a third passivation.

It is preferable in the fabrication method of the Hall device that the first passivation be composed of $SiO_2$, and the second passivation be composed of $Si_3N_4$.

Furthermore, it is preferable that the semiconductor thin films be formed on the substrate composed of GaAs or Si, the active layer be composed of InAs, and the compound semiconductor layers be each composed of $Al_{Z1}Ga_{1-Z1}As_{Y2}Sb_{1-Y2}$ ($0 \leq Z1 \leq 1$, $0 \leq Y2 \leq 0.3$).

BRIEF DESCRIPTION OF THE DRAWINGS

FIGS. 19A and 19B are histograms illustrating rVu+Vu variations, wherein FIG. 19A illustrates a case of a Hall device in accordance with the present invention, and FIG. 19B illustrates a case of a Hall device with a conventional structure;

BEST MODE FOR CARRYING OUT THE INVENTION

The best mode for carrying out the invention will now be described with reference to the accompanying drawings.

Figure 3:
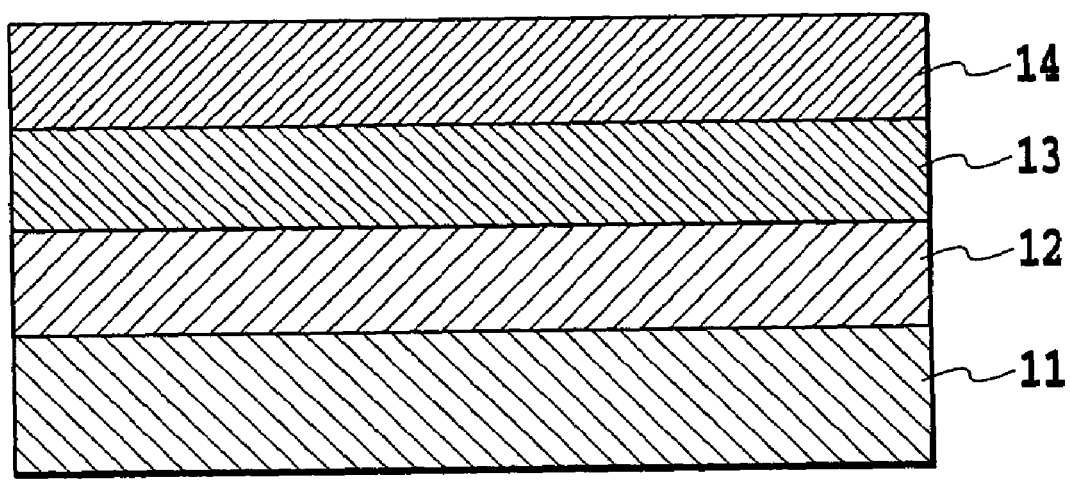
FIG. 3 is a view showing a compound semiconductor stacked structure in accordance with the present invention.

FIG. 3 is a cross-sectional view showing a compound semiconductor stacked structure in accordance with the present invention. In FIG. 3, the reference numeral 11 designates a substrate, 12 designates a first compound semiconductor layer, 13 designates an active layer composed of a compound semiconductor, and 14 designates a second compound semiconductor layer. The compound thin films 12-14 are stacked successively on the substrate 11. Another structure having a third compound semiconductor layer on the second compound semiconductor layer 14 as needed is also possible to prevent the deterioration of the surface of the second compound semiconductor layer 14 by oxidation.

The first compound semiconductor layer 12 and second compound semiconductor layer 14 are each a multinary compound semiconductor layer including at least three elements. More specifically, they are each a high resistance compound semiconductor layer including Sb as a constituent element, and at least two elements selected from a group of Al, Ga, In, As and P, and preferably a compound semiconductor with a composition represented by $Al_ZGa_{1-Z}As_YSb_{1-Y}$. The composition ratios are preferably $0.0 \leq Z \leq 1.0$ and $0.0 \leq Y \leq 0.3$, and more preferably $0.4 \leq Z \leq 1.0$ and $0.0 \leq Y \leq 0.15$, and still more preferably $0.45 \leq Z \leq 1.0$ and $0.0 \leq Y \leq 0.12$.

The thickness of the first compound semiconductor layer 12 is usually from 150 nm to 1 μm, and preferably in a range from 300 nm to 700 nm. Considering actual device fabrication process, the thinner first compound semiconductor layer 12 facilitates the process, thereby presenting a great industrial advantage. The thickness of the second compound semiconductor layer 14 is usually from 5 nm to 100 nm, and preferably in a range from 30 nm to 70 nm.

The first and second compound semiconductor layers 12 and 14 must have a resistance value of at least five times greater than the resistance value of the active layer 13, and are designed to have a resistance value preferably of more than 100 times, and more preferably of more than 1000 times. In addition, the layers 12 and 14 must have a band gap greater than the band gap of the active layer 13, usually several times greater than the band gap of the active layer 13.

The compound semiconductor constituting the active layer 13 is preferably $In_xGa_{1-x}As_ySb_{1-y}$ ($0.8 \leq x \leq 1.0$, $0.8 \leq y \leq 1.0$) or InAs. When using $In_xGa_{1-x}As_ySb_{1-y}$, its composition is preferably $0.88 \leq x \leq 1.0$ and $0.82 \leq y \leq 1.0$, and more preferably $0.9 \leq x \leq 1.0$ and $0.9 \leq y \leq 1.0$.

The active layer 13 is made thicker than 30 nm and thinner than 100 nm, and is preferably from 35 nm to 90 nm, and still more preferably from 40 nm to 70 nm. This is because when the active layer 13 becomes thin, the variations increase of the electron mobility and sheet resistance due to the Sb composition variations of the first and second compound semiconductor layers 12 and 14, which makes industrial fabrication difficult. On the other hand, when the active layer 13 becomes too thick, the electron mobility itself is reduced, and the variations increase of the electron mobility and sheet resistance due to the Sb composition variations of the first and second compound semiconductor layers 12 and 14, which makes the industrial fabrication difficult.

The lattice constants of the first and second compound semiconductor layers 12 and 14 are set such that the lattice constant difference from the lattice constant of the active layer 13 becomes 0.0%-1.2%, and preferably in a range from 0.1% to 1.0%, and more preferably in a range from 0.2% to 0.9%. As for the lattice constants of these compound semiconductor crystals, since they depend on the element compositions of the layers according to "Vegard's law", the compositions of the layers are determined such that the lattice constant differences between them become optimum. Here, if the lattice constants of the first and second compound semiconductor layers 12 and 14 are too large or too small with respect to the lattice constant of the active layer 13, the characteristics such as the electron mobility can vary greatly because of the composition variations in Sb in the first and second compound semiconductor layers 12 and 14.

As for the structure having the third compound semiconductor layer on the second compound semiconductor layer 14, its material is preferably GaAs or GaAsSb. In particular, using GaAs shows a tendency to reduce variations in the device characteristics when the compound semiconductor stacked structure in accordance with the present invention is formed into a device. In this case, the thickness of the GaAs layer is usually from 0.5 nm to 50 nm, and preferably from 3 nm to 30 nm, and more preferably from 6 nm to 15 nm.

Although the substrate 11 is not particularly limited in material, it is selected considering the lattice constant of the compound semiconductor layer 12 stacked thereon. For example, a compound semiconductor wafer such as GaAs, GaP, InP and InSb, or a Si wafer is preferable. The surface orientation for growing crystal is preferably (100), (111) and (110).

The compound semiconductor stacked structure as shown in FIG. 3 can achieve stable electric characteristics such as electron mobility and sheet resistance. This is because the compound semiconductor stacked structure with such a construction has the optimum relationships between the thicknesses of the individual layers and the lattice constants (that is, compositions), and hence even if composition variations in Sb occur which is included in the first and second compound semiconductor layer without exception, the variations do not vary the electric characteristics sharply.

According to the study of the inventors of the present invention, it is difficult for the conventional quantum well compound semiconductor stacked structure to achieve the electron mobility and sheet resistance with high reproducibility because the control is difficult of Sb included in the first and second compound semiconductor layers without exception, and the resultant Sb composition variations change the characteristics of the electron mobility sharply. Therefore to achieve stable characteristics, a structure must be employed which can reduce the effect of the Sb composition variations on the electric characteristics.

According to Japanese Patent Nos. 3069545 and 2793440, the thickness of the sensor layer such as InAs is preferably 20 nm or less to form a Hall sensor with the quantum effect. In contrast, the inventors of the present invention found that the variations in the electron mobility and sheet resistance due to the Sb composition variations in the compound semiconductor layers can be suppressed by designing the thickness of the sensor layer (active layer) at a thickness greater than 20 nm, and by setting the lattice constants of the first and second compound semiconductor layers in a range from 0.0% to 1.2% of the lattice constant of the active layer, thereby constructing the compound semiconductor stacked structure in accordance with the present invention.

In the compound semiconductor stacked structure with the construction as shown in FIG. 3, the thickness of the active layer 13, and the lattice constant differences between the first and second compound semiconductor layers 12 and 14 and the active layer 13 (degree of the lattice mismatch) have their optimum values. The reason for this is considered to be as follows.

As for the compound semiconductor layers, it is experimentally verified that the crystallinity becomes better with an increase of the Sb composition in the layers. An increase of the Sb composition in the layers, however, increases the degree of the lattice mismatch with the crystals constituting the active layer 13. In this case, if the layer thickness of the active layer 13 is thin, the lattice mismatch of about 1% has little effect, and the electron mobility in the active layer 13 increases with an increase in the Sb composition in the compound semiconductor layers. As a result, the sheet resistance is reduced, thereby increasing the variations in the characteristics.

On the other hand, when the active layer 13 is thick, even the lattice mismatch of about 1% has some influence so that as the Sb composition in the compound semiconductor layer increases, a stress is applied to the crystals and the electron mobility is reduced. As a result, the electron mobility in the active layer 13 becomes nearly constant regardless of the Sb composition in the compound semiconductor layer, and the sheet resistance is within a predetermined range. In addition, when the active layer 13 is very thin such as 20 nm or less, the effect of the Sb composition variations and of the film thickness variations is brought to the fore so that the high electric characteristics are not reproducible.

As for the thickness of the first compound semiconductor layer 12, Japanese Patent Nos. 3069545 and 2793440 describe that it is preferably set at 1 µm to achieve the quantum effect. The present invention, however, does not require such a thick layer. The reason for this is considered that the active layer 13 is made thick in the present invention.

Configuring a magnetic sensor using the compound semiconductor stacked structure with the foregoing construction in accordance with the present invention makes it possible to fabricate a highly sensitive, high input resistance, good temperature characteristic magnetic sensor stably with high reproducibility. In addition, such a magnetic sensor is suitable for the mobile equipment such as mobile phones because of the lower power consumption than the magnetic sensor with the conventional structure.

Figure 4:
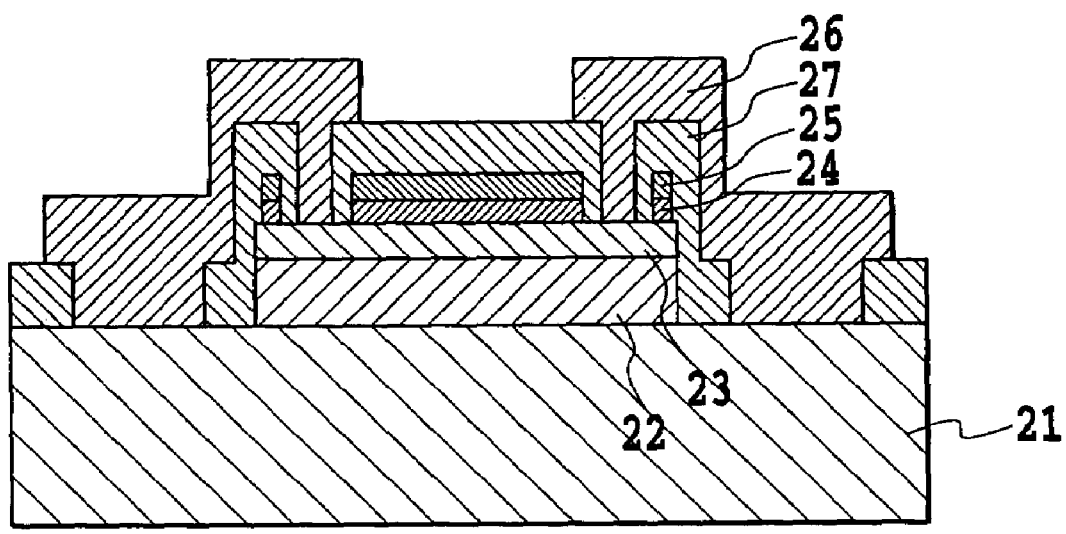
FIG. 4 is a cross-sectional view showing a structure of a magnetic sensor in accordance with the present invention.

FIG. 4 is a cross-sectional view showing a structure of a magnetic sensor in accordance with the present invention, which is configured by using the compound semiconductor stacked structure with the construction as shown in FIG. 3. In FIG. 4, the reference numeral 21 designates a substrate, 22 designates a first compound semiconductor layer, 23 designates an active layer composed of a compound semiconductor, 24 designates a second compound semiconductor layer, and 25 designates a third compound semiconductor layer. The parameters such as the composition and film thicknesses of the compound semiconductor layers 22-25 are the same as those of FIG. 3. The stacked structure composed of the layers 22 to 25 is called "semiconductor thin films". In addition the reference numeral 26 designates a metal electrode layer, and 27 designates a passivation.

The metal electrode layer 26 is usually an ohmic electrode, and preferably makes an ohmic contact with the sensor layer (active layer 23). Its material can be AuGe/Ni/Au constituting a multilayer electrode, or a metal constituting a single layer. For example, when the active layer is composed of InAs, the metal electrode layer 26 can be composed of Ti/Au, and when the former is composed of GaAs, the latter is often composed of AuGe/Ni/Au. In addition, as for a material constituting the passivation 27, SiN or $SiO_2$ is preferable, and it can be a single layer or multilayer.

The magnetic sensor in accordance with the present invention includes a Hall device, a magnetic resistance device and the like.

Next, the present invention will be explained from a viewpoint of improving the unbalanced voltage.

In FIG. 4, the first compound semiconductor layer 22 and second compound semiconductor layer 24 have a band gap greater than that of the active layer 23. The metal electrode layer 26 is electrically isolated from the first compound semiconductor layer 22, second compound semiconductor layer 24 and third compound semiconductor layer 25 by the passivation 27, and makes contact with the semiconductor thin films only with the active layer 23. This enables the current to flow through the active layer 23 stably. In contrast, in the conventional Hall device, the metal electrode layer 26 makes contact not only with the active layer 23, but also with the first compound semiconductor layer 22, second compound semiconductor layer 24 and third compound semiconductor layer 25. The present invention differs from the conventional device in this point.

More specifically, the Hall device has the semiconductor thin films 22-25, which include the active layer 23 composed of $In_{X1}Ga_{1-X1}As_{Y1}Sb_{1-Y1}$ ($0 \leq X1 \leq 1$, $0 \leq Y1 \leq 1$) and the compound semiconductor layers 22, 24 and 25 formed on and under the active layer 23 and having the band gap greater than that of the active layer 23, and the metal electrode layer 26 and passivation 27, in which the metal electrode layer 26 makes contact only with the active layer 23 among the semiconductor thin films 22-25, and all the top surfaces and side surfaces of the semiconductor thin films 22-25 other than the contact surface are covered with the passivation 27.

Since the first compound semiconductor layer 22, second compound semiconductor layer 24 and third compound semiconductor layer 25 have all their top surfaces and side surfaces covered directly with the passivation 27, they are not exposed to the moisture in the atmosphere.

As the material of the active layer 23, the compound semiconductor with the high electron mobility is used. The material of the active layer in accordance with the present invention is not limited in particular as long as it is a compound semiconductor layer represented by $In_{X1}Ga_{1-X1}As_{Y1}Sb_{1-Y1}$ ($0 \leq X1 \leq 1$, $0 \leq Y1 \leq 1$). However, considering the device sensitivity, device power consumption and temperature characteristics comprehensively, InAs is preferable.

To achieve a desired device resistance, the active layer can be doped with Si, Sn or the like as needed. As for the first compound semiconductor layer 22 and second compound semiconductor layer 24, their materials are not limited in particular as long as they have a band gap greater than that of the active layer 23, and the materials may be different.

The reason why the structure, in which the compound semiconductor layers sandwich the active layer, can implement the high electron mobility is that the electrons are confined in the active layer and move two-dimensionally. The confinement of the electrons becomes more effective as the difference between the upper ends of the conduction bands is greater. A combination of the active layer and the compound semiconductor layers that provides a large difference of the band gaps is suitable for the Hall device in accordance with the present invention.

More specifically, the difference between the band gaps is preferably 0.3 eV or more, and more preferably 0.7 eV and more. To achieve a sufficient difference between the band gaps, InAs (band gap 0.36 eV) is suitable for the active layer, and AlGaAsSb is suitable as the material of the compound semiconductor layers in this case. As shown in Table 1, AlGaAsSb has a wide range of the band gap (0.72-2.13 eV) depending on the composition ratios. Considering the lattice matching with InAs, $Al_{Z1}Ga_{1-Z1}As_{Y2}Sb_{1-Y2}$ ($0 \leq Z1 \leq 1$, $0 \leq Y2 \leq 0.3$) is preferable as the compound semiconductor layers.

TABLE 1

| Semiconductor material | Lattice constant (Å) | Orbidden bandwidth (eV) |
| --- | --- | --- |
| AlP | 5.451 | 2.5 |
| AlAS | 5.661 | 2.13 |
| AlSB | 6.136 | 1.58 |
| GaP | 5.451 | 2.26 |
| GaAs | 5.653 | 1.42 |
| GaSb | 6.096 | 0.72 |
| InP | 5.869 | 1.35 |

TABLE 1-continued

| Semiconductor material | Lattice constant (Å) | Orbidden bandwidth (eV) |
|---|---|---|
| InAs | 6.058 | 0.36 |
| InSb | 6.479 | 0.17 |
| Si | 5.431 | 1.12 |

Although AlGaAsSb in the foregoing composition range has a lattice constant greatly different from that of GaAs and Si commonly used as a substrate material, it is known that when AlGaAsSb is formed on the substrate, lattice relaxation occurs at an initial stage, and then a high quality thin film is formed at the lattice constant characteristic to AlGaAsSb. Thus, it is suitable for the first compound semiconductor layer material.

Furthermore, it is preferable that the semiconductor thin films be formed on the GaAs or Si substrate, and that the active layer be composed of InAs, and the compound semiconductor layers be composed of $Al_{Z1}Ga_{1-Z1}As_{Y2}Sb_{1-Y2}$ ($0 \leq Z1 \leq 1$, $0 \leq Y2 \leq 0.3$).

AlGaAsSb is more susceptible to oxidation than GaAs based materials, which makes it difficult to carry out the interface control because of residual oxide at the interface on which the metal electrode layer is formed. Thus, the current path becomes unstable. Accordingly, the present invention has a particular advantage in the Hall device including the AlGaAsSb layer. In addition, to prevent the surface oxidation, the third compound semiconductor layer, the GaAsSb layer, is formed on the second compound semiconductor layer, the AlGaAsSb layer.

Figure 5:
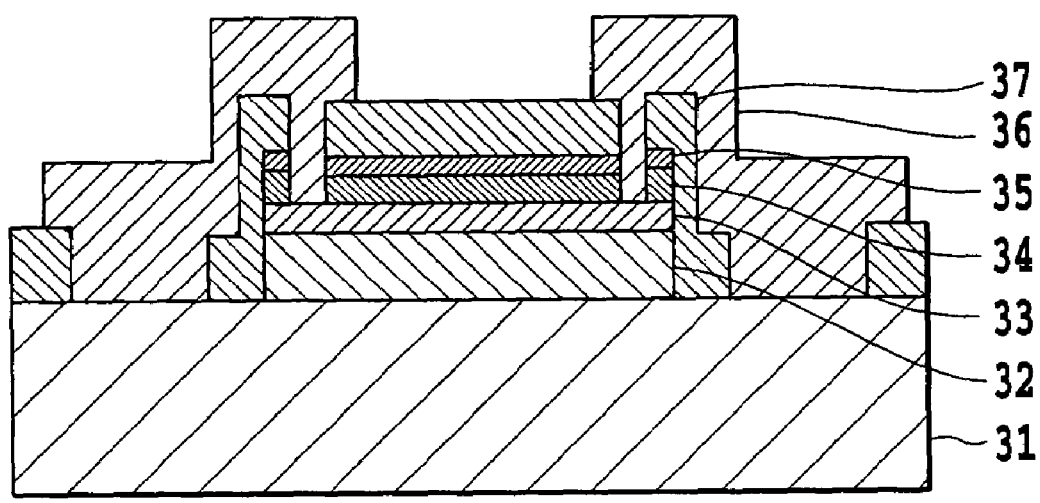
FIG. 5 is a cross-sectional view illustrating a structure of another embodiment of the compound semiconductor Hall device.

FIG. 5 is a cross-sectional view illustrating a structure of another embodiment of the compound semiconductor Hall device. In FIG. 5, reference numeral 31 designates a substrate, 32 designates a first compound semiconductor layer, 33 designates an active layer, 34 designates a second compound semiconductor layer, 35 designates a third compound semiconductor layer, 36 designates a metal electrode layer, and 37 designates a passivation. The first compound semiconductor layer 32 and second compound semiconductor layer 34 have a band gap greater than that of the active layer 33. Although the third compound semiconductor layer 35 in accordance with the present invention is composed of InGaAs, that of the conventional Hall device is composed of GaAsSb, which is the difference between the present invention and the conventional device.

More specifically, the Hall device in accordance with the present invention has the semiconductor thin films 32-35, which include the active layer 33 composed of $In_{X1}Ga_{1-X1}As_{Y1}Sb_{1-Y1}$ ($0 \leq X1 \leq 1$, $0 \leq Y1 \leq 1$); the compound semiconductor layers 32 and 34, which are formed on and under the active layer 33, contain Sb and have a band gap greater than that of the active layer 33; the compound semiconductor layer 35 serving as the cap layer; the metal electrode layer 36 and the passivation 37. The Hall device is characterized by having the third compound semiconductor layer 35 composed of $In_{X2}Ga_{1-X2}As$ ($0 \leq X2 \leq 1$) and serving as the cap layer on the compound semiconductor layer 34.

The Hall device, which has InAs as the active layer 32, and AlGaAsSb as the first compound semiconductor layer 32 and second compound semiconductor layer 33, has the third compound semiconductor layer 35 serving as the cap layer to prevent the surface oxidation. The third compound semiconductor layer 35 uses a compound semiconductor insusceptible to oxidation. Although the material of the cap layer is not limited in particular as long as it is a compound semiconductor layer represented by $In_{X2}Ga_{1-X2}As$ ($0 \leq X2 \leq 1$), GaAs is preferable because it is insusceptible to oxidation, and has a large band gap and high resistance.

Figure 6:
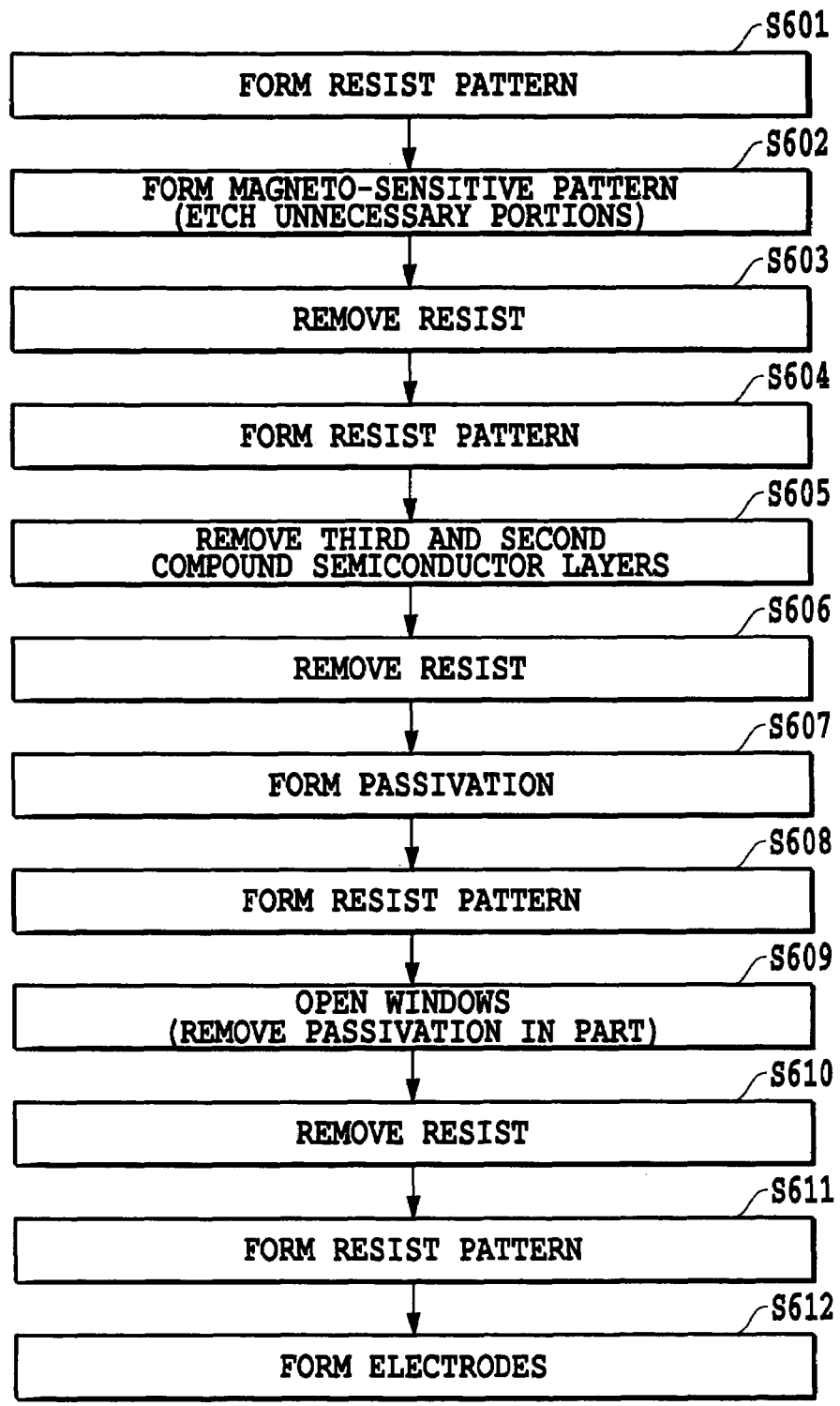
FIG. 6 is a flowchart illustrating a fabrication process of the compound semiconductor Hall device of FIG. 4.

FIG. 6 is a flowchart illustrating a fabrication method of the compound semiconductor Hall device in accordance with the present invention. The Hall device as shown in FIG. 4 can be fabricated by the fabrication method. A concrete fabrication process will be described later. To implement the device structure, in which the metal electrode layer 26 makes contact only with the active layer 23 among the semiconductor thin films 22-25, and all the top surfaces and side surfaces of the semiconductor thin films other than the contact surface are directly covered with the passivation 27, the method is taken in which the active layer 23 contacting the metal electrode layer 26 is exposed by etching, and is covered by the passivation 27 before forming the metal electrode layer 26. As long as these steps are taken, although there is no restriction in particular, it is preferable that the passivation 27 serving as the cover be formed immediately after the etching process to prevent the side surfaces of the compound semiconductors exposed by the etching from being damaged by the following processes.

Figure 7:
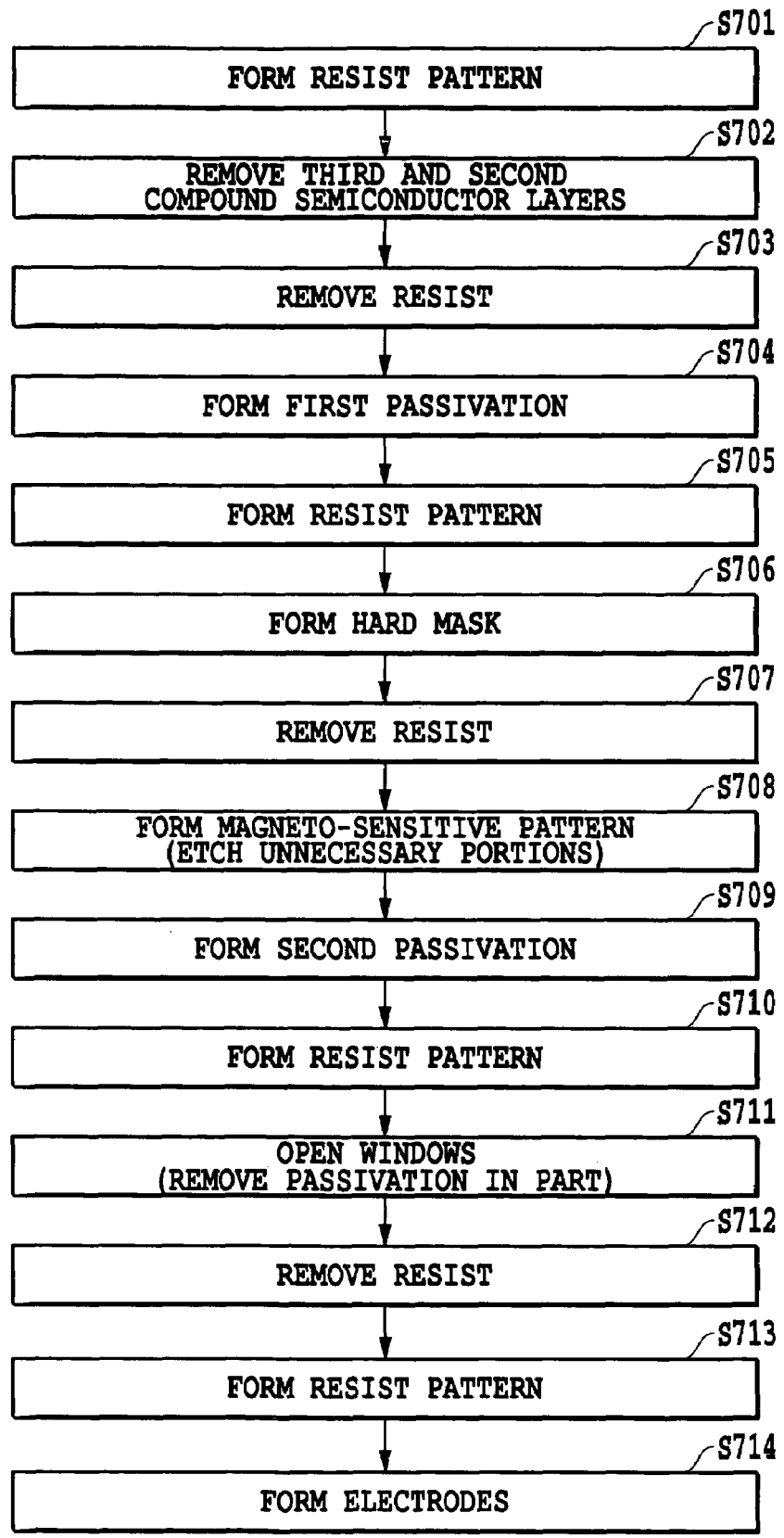
FIG. 7 is a flowchart illustrating a fabrication process of a compound semiconductor Hall device of FIG. 8.
Figure 8:
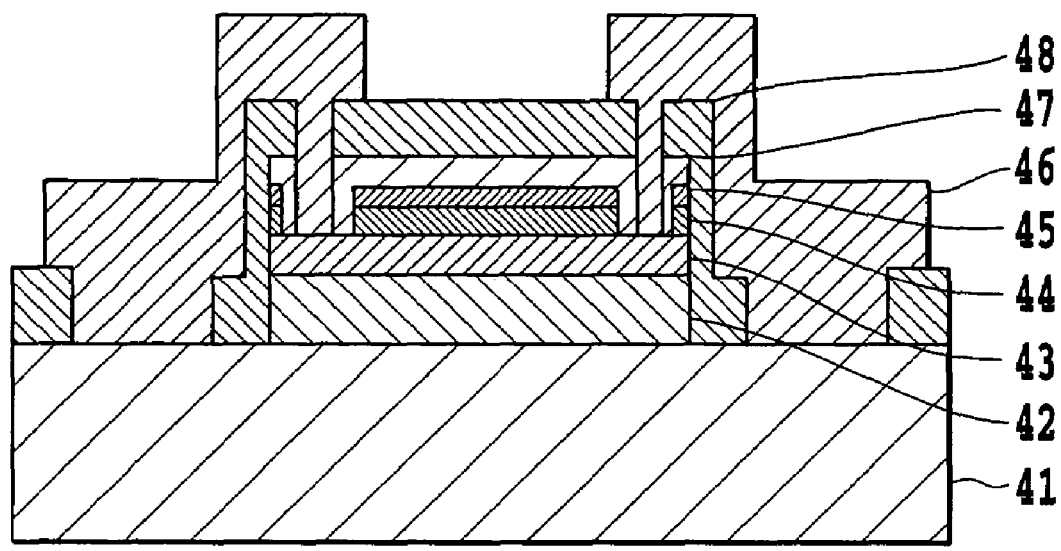
FIG. 8 is a cross-sectional view illustrating still another embodiment of the compound semiconductor Hall device in accordance with the present invention.

To reduce damage on the semiconductor thin film surfaces due to the process, the steps in the flowchart illustrated in FIG. 7 is preferably taken (a cross-sectional view of the Hall device fabricated is shown in FIG. 8, a concrete fabrication process of which will be described later). After forming the semiconductor thin film, the above-mentioned etching process is carried out, first, followed by covering with a first passivation 47. Using the first passivation 47 as a mask for forming the magneto-sensitive pattern, the magneto-sensitive pattern is formed, followed by covering with a second passivation 48. In FIG. 8, the reference numeral 41 designates a substrate, 42 designates a first compound semiconductor layer, 43 designates an active layer, 44 designates a second compound semiconductor layer, 45 designates a third compound semiconductor layer, and 46 designates a metal electrode layer.

Figure 9:
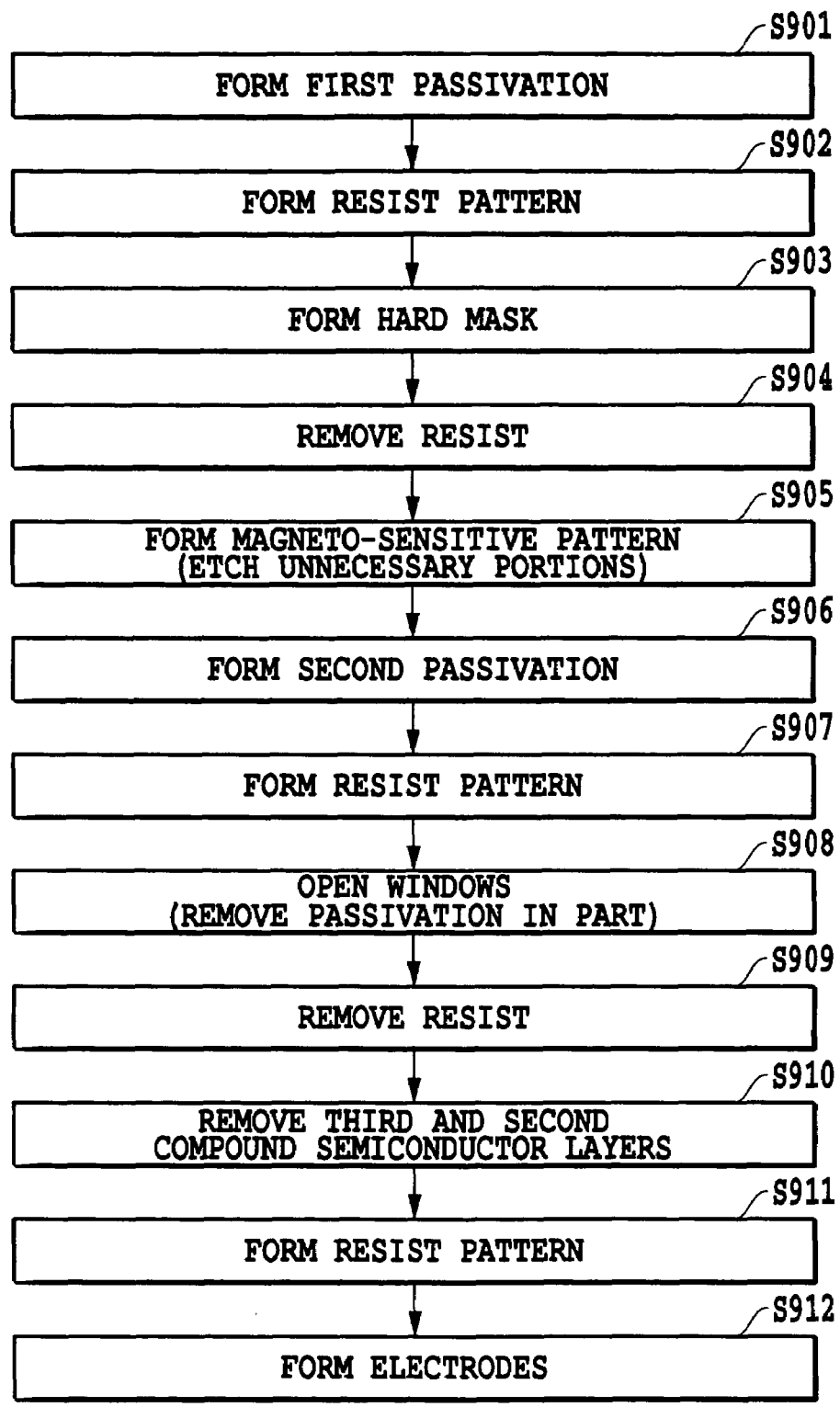
FIG. 9 is a flowchart illustrating a fabrication process of a compound semiconductor Hall device of FIG. 10.

To improve the soldering heat resistance of the Hall device, a fabrication method as shown in FIG. 9 can be taken as an alternative of forming the foregoing InGaAs cap layer (third compound semiconductor layer). The concrete fabrication process will be described later.

Figure 10:
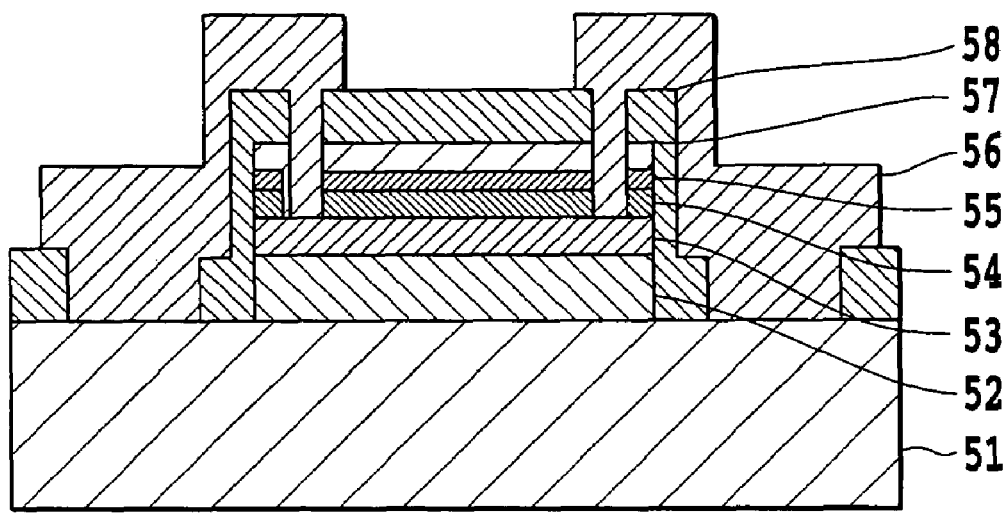
FIG. 10 is a cross-sectional view illustrating still another embodiment of the compound semiconductor Hall device.

FIG. 10 is a cross-sectional view illustrating a structure of the Hall device formed by the fabrication method as shown in FIG. 9. In FIG. 10, the reference numeral 51 designates a substrate, and reference numerals 52-55 designate semiconductor thin films. That is, the reference numeral 52 designates a first compound semiconductor layer, 53 designates an active layer, 54 designates a second compound semiconductor layer, and 55 designates a third compound semiconductor layer. In addition, the reference numeral 56 designates a metal electrode layer, 57 designates a first passivation, and 58 designates a second passivation.

To prevent the surfaces of the semiconductor thin films from being exposed to such processes as resist coating and $O_2$ ashing, the method is characterized by forming the first passivation 57 immediately after forming the semiconductor thin films.

Although the fabrication method can ensure sufficiently high soldering heat resistance even when the third compound semiconductor layer 55 is composed of GaAsSb, a combination with the InGaAs cap layer can achieve still higher reliability.

Figure 11:
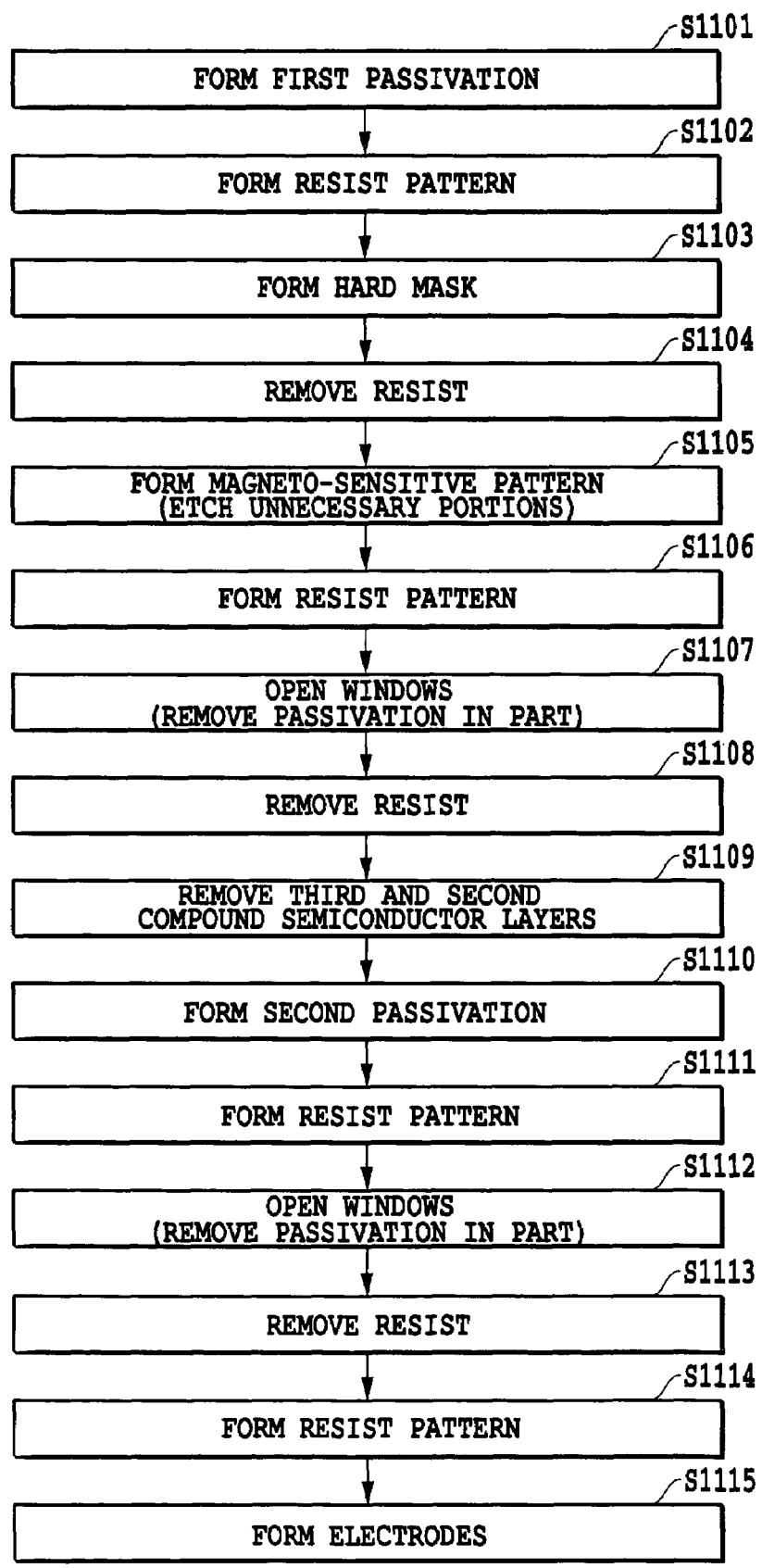
FIG. 11 is a flowchart illustrating a fabrication process of a compound semiconductor Hall device of FIG. 13.
Figure 12:
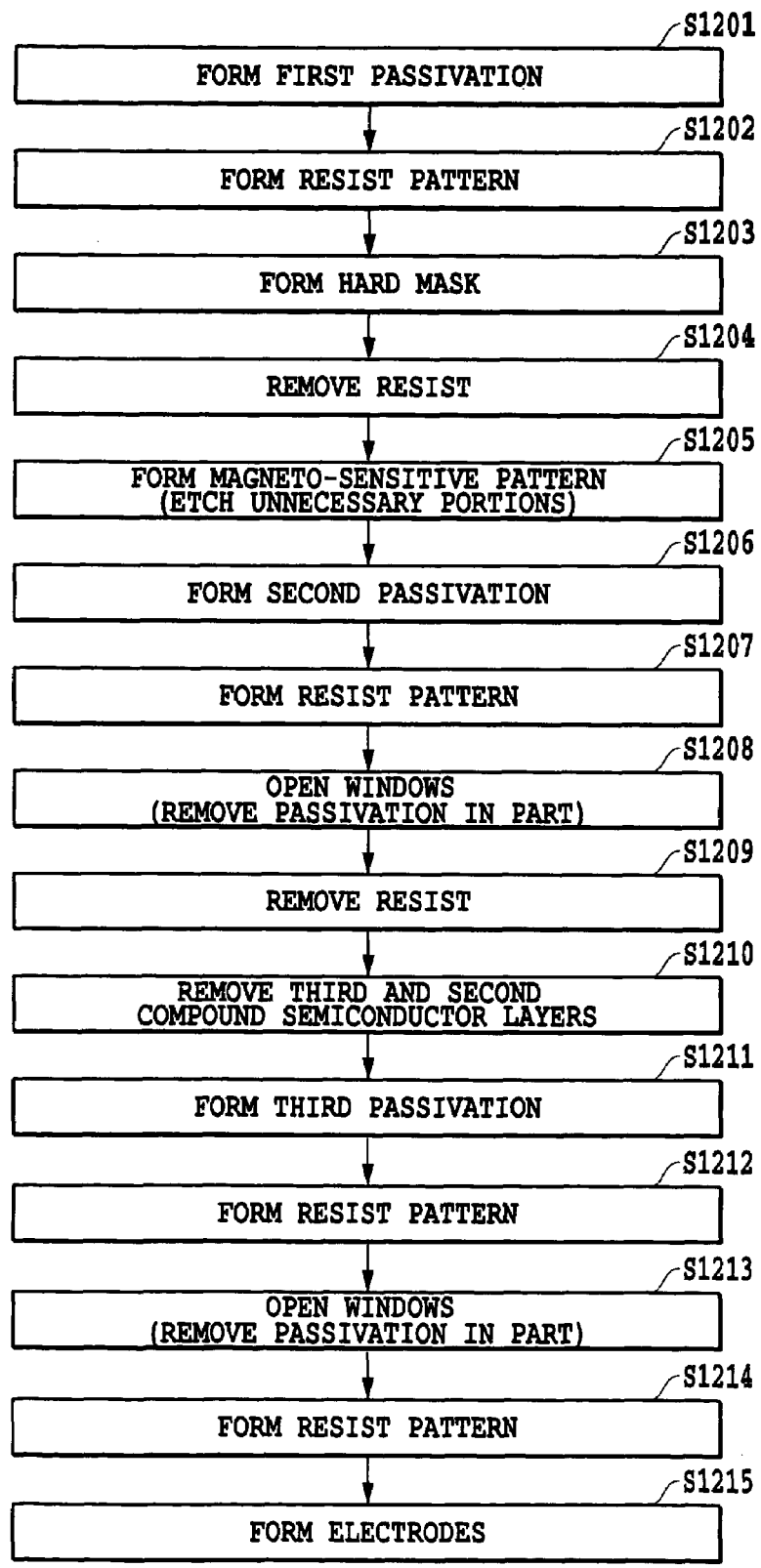
FIG. 12 is a flowchart illustrating a fabrication process of a compound semiconductor Hall device of FIG. 14.
Figure 13:
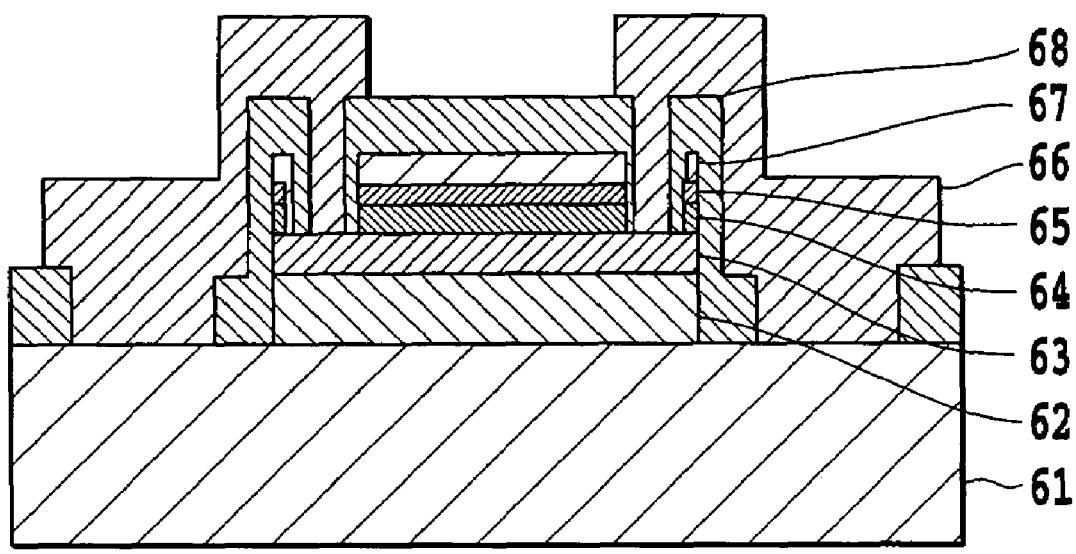
FIG. 13 is a cross-sectional view illustrating still another embodiment of the compound semiconductor Hall device.
Figure 14:
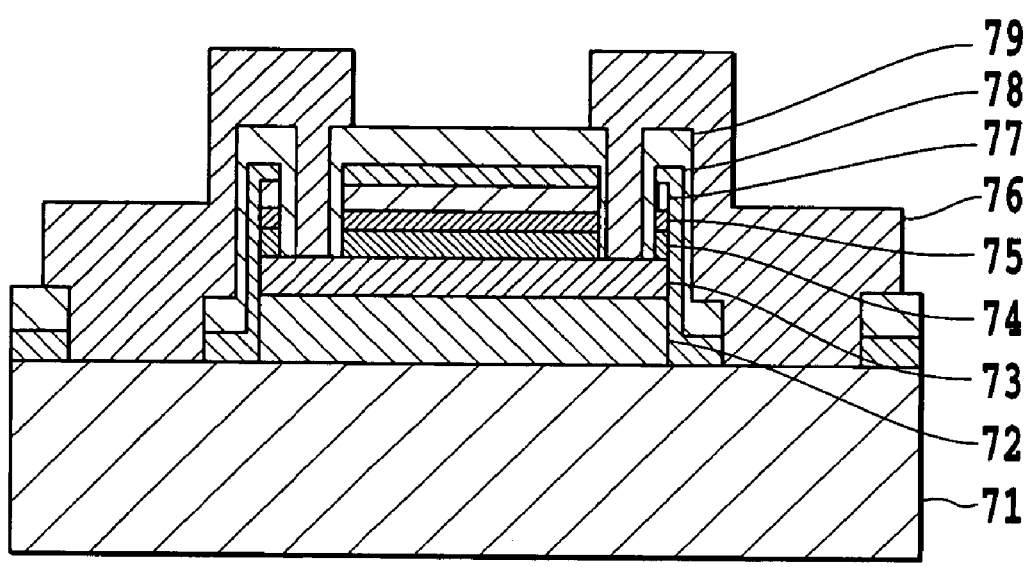
FIG. 14 is a cross-sectional view illustrating still another embodiment of the compound semiconductor Hall device.

FIGS. 11 and 12 are flowcharts each illustrating a concrete fabrication method. The concrete fabrication processes will be described later. FIGS. 13 and 14 are cross-sectional views each showing a structure of a Hall device formed by these fabrication methods. In FIGS. 13 and 14, reference numerals 61 and 71 each designate a substrate, 62 and 72 each designate a first compound semiconductor layer, 63 and 73 each designate an active layer, 64 and 74 each designate a second compound semiconductor layer, 65 and 75 each designate a third compound semiconductor layer, 66 and 76 each designate a metal electrode layer, 67 and 77 each designate a first passivation, 68 and 78 each designate a second passivation and the reference numeral 79 designates a third passivation.

Returning to FIG. 10, on and under the active layer 53 composed of $In_{X1}Ga_{1-X1}As_{Y1}Sb_{1-Y1}$ ($0 \leq X1 \leq 1$, $0 \leq Y1 \leq 1$), the compound semiconductor layers 52 and 54 containing Sb and having the band gap greater than that of the active layer 53 are formed, followed by forming the compound semiconductor layer 55 serving as the cap layer, thereby forming the semiconductor thin films. After forming the semiconductor thin films, the first passivation 57 is formed, first. Using the patterned first passivation 57 as a mask, the semiconductor thin films are removed by etching except for the magneto-sensitive pattern and the contact regions with the electrodes. Subsequently, the substrate 51, semiconductor thin films and first passivation 57 exposed by the etching process are covered with the second passivation 58. Then after patterning the second passivation 58, the metal electrode layer 56 is formed.

In FIG. 13, on and under the active layer 63 composed of $In_{X1}Ga_{1-X1}As_{Y1}Sb_{1-Y1}$ ($0 \leq X1 \leq 1$, $0 \leq Y1 \leq 1$), the compound semiconductor layers 62 and 64 containing Sb and having the band gap greater than that of the active layer 63 are formed, followed by forming the compound semiconductor layer 65 serving as the cap layer, thereby forming the semiconductor thin films. After forming the semiconductor thin films, the first passivation 67 is formed, first. Using the patterned first passivation 67 as a mask, the semiconductor thin films are removed by etching except for the magneto-sensitive pattern and the contact regions with the electrodes. Then, the upper compound semiconductor layers 64 and 65 together with the first passivation 67 and cap layer are removed by the etching process to expose the active layer 63 that will make contact with the metal electrode layer 66. After that, the substrate 61, semiconductor thin films and first passivation 67 exposed by the etching process are covered with the second passivation 68. Then after patterning the second passivation 68, the metal electrode layer 66 is formed.

Furthermore, in FIG. 14, on and under the active layer 73 composed of $In_{X1}Ga_{1-X1}As_{Y1}Sb_{1-Y1}$ ($0 \leq X1 \leq 1$, $0 \leq Y1 \leq 1$), the compound semiconductor layers 72 and 74 containing Sb and having the band gap greater than that of the active layer 73 are formed, followed by forming the compound semiconductor layer 75 serving as the cap layer, thereby forming the semiconductor thin films. After forming the lo semiconductor thin films, the first passivation 77 is formed, first. Using the patterned first passivation 77 as a mask, the semiconductor thin films are removed by etching except for the magneto-sensitive pattern and the contact regions with the electrodes. Subsequently, the substrate 71, semiconductor thin films and first passivation 77 exposed by the etching process are covered with the second passivation 78. Then, the upper compound semiconductor layers 74 and 75 together with the second passivation 78, first passivation 77 and cap layer are removed by the etching process to expose the active layer 73 that will make contact with the metal electrode layer 76. After that, the semiconductor thin films and second passivation 78 exposed by the etching process are covered with the third passivation 79. Then after patterning the third passivation 79, the metal electrode layer 76 is formed.

As for the material of the passivations, it is not limited in particular. However, when the magneto-sensitive pattern forming process is carried out by physical etching such as ion milling, since the first passivation is etched at the same time, it must be sufficiently thick. Thus, $SiO_2$ is preferable which has good adhesion. As for the second passivation, $Si_3N_4$ is preferable considering the moisture resistance.

As for the method of exposing the active layer surface, it is not limited in particular. However, selective etching using etchant that disables the etching of the active layer composed of InAs or the like, and enables the etching of the compound semiconductor layers containing Sb can prevent the etching of the InAs surface, thereby being able to facilitate the process control. When the cap layer is composed of InGaAs, the active layer surface can be exposed by the selective etching, after removing at least the cap layer by the physical etching such as ion milling. Etching the active layer surface after the selective etching has an advantage of being able to reduce the variations in the unbalanced voltage in the high temperature, high moisture test and in the soldering heat resistant test. The etching method is not limited in particular. As for the etching amount, although it is not limited in particular, it is preferably half the thickness of the active layer or less.

Figure 15:
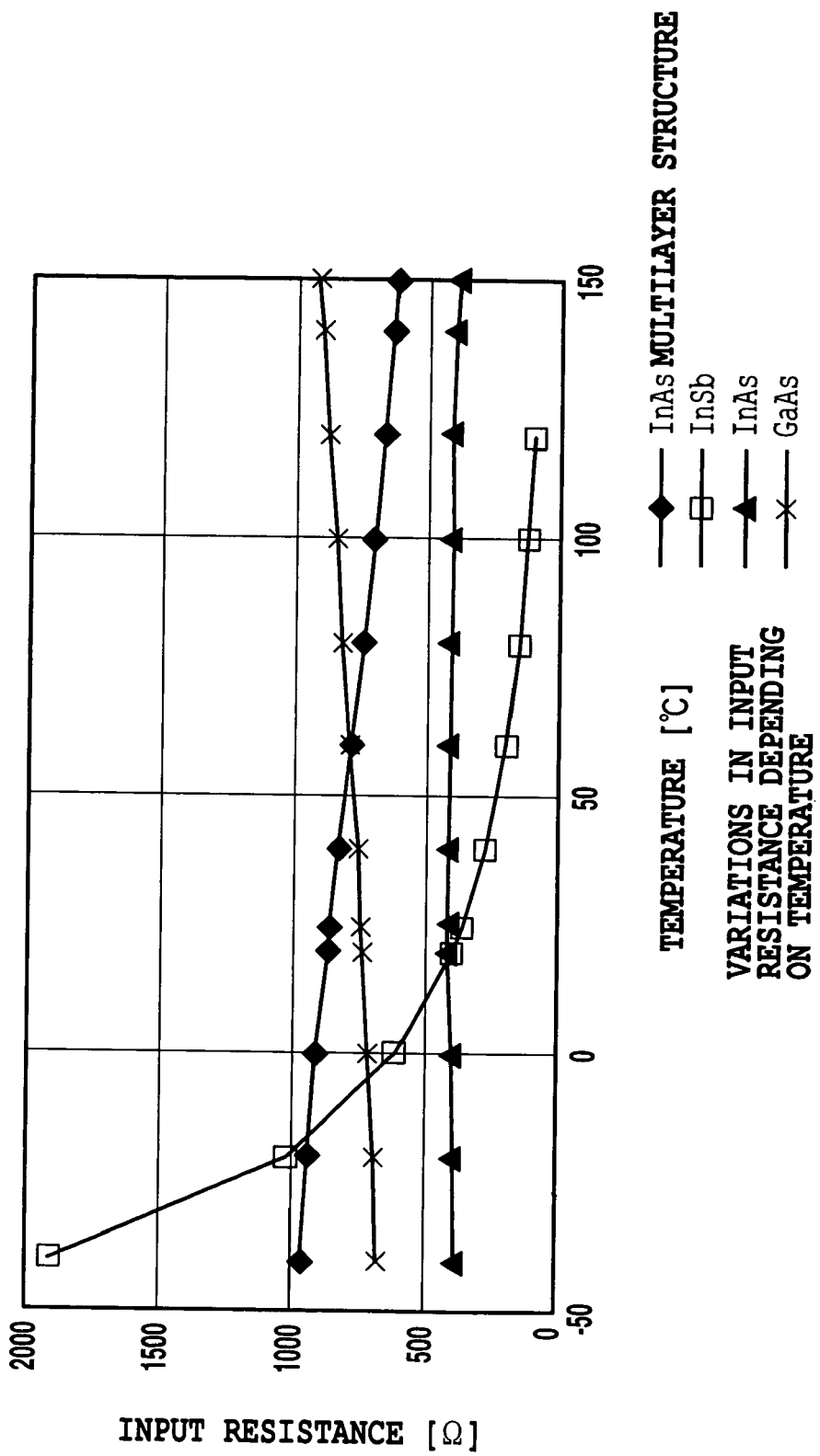
FIG. 15 is a graph illustrating the resistance temperature characteristics of a Hall device having an InAs multilayer structure as its magneto-sensitive pattern, and of Hall devices each having a single layer InSb, InAs or GaAs as their magneto-sensitive pattern.

FIG. 15 is a graph illustrating the resistance temperature characteristics of the Hall device having an InAs multilayer structure as its magneto-sensitive pattern, and those of the Hall devices having single layer InSb, InAs and GaAs as their magneto-sensitive patterns.

Although InSb has large resistance variations in temperature which vary exponentially, the Hall device with the InAs multilayer film or with the single layer InAs or GaAs has small and linear variations. That the resistance variations are linear as well as small offers an advantage of facilitating the temperature correction required for designing a circuit with higher accuracy.

Figure 16:
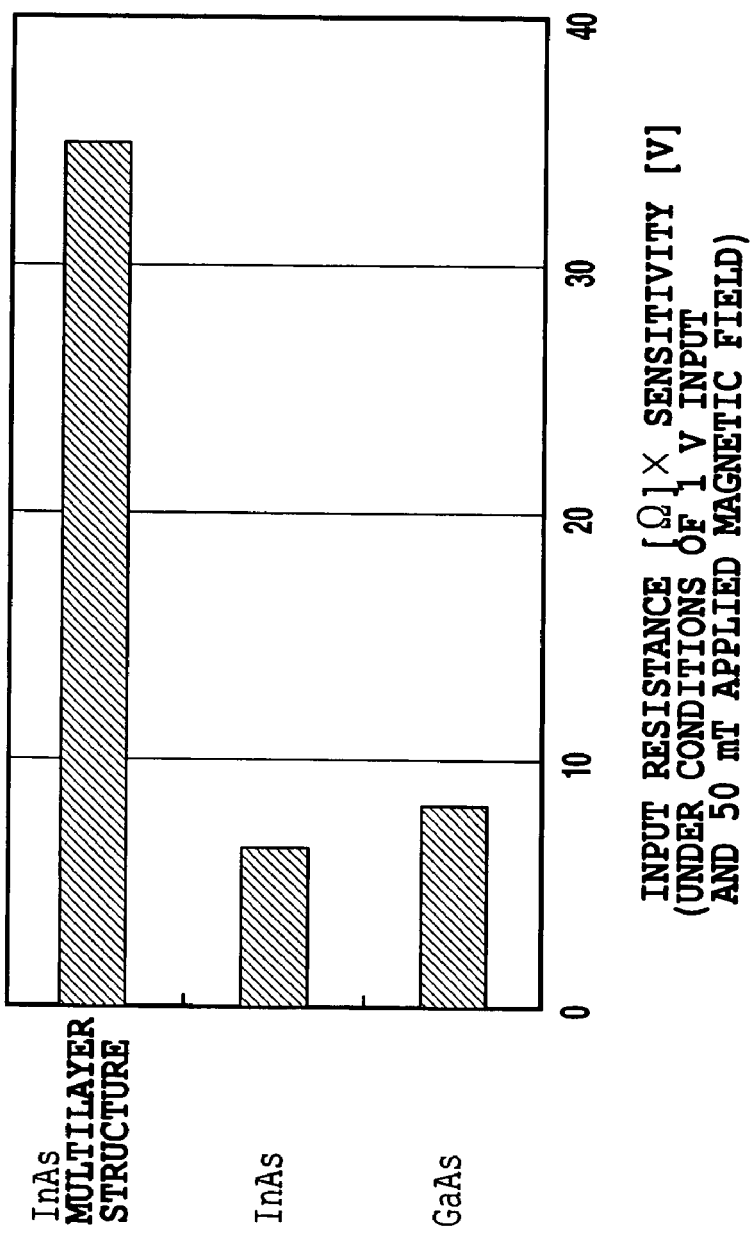
FIG. 16 is a graph illustrating characteristics of the input resistance R and sensitivity Vh of Hall devices having InAs, GaAs and an InAs multilayer structure with good temperature characteristics as their magneto-sensitive patterns.

FIG. 16 is a graph illustrating the characteristics of the input resistance R and sensitivity Vh of the Hall devices having the magneto-sensitive patterns composed of InAs, GaAs and the InAs multilayer structure with good temperature characteristics.

The greater the value of the input resistance R×sensitivity Vh, the higher the resistance and sensitivity of the Hall device, which indicates that the Hall device is suitable for the mobile equipment. Compared with the Hall devices with the single layer InAs and GaAs, the Hall device with the InAs multilayer structure has the value four times or more greater.

When the input resistance R×sensitivity Vh is 20 [Ω·V] (1 V·50 mT) or more, the Hall device is considered to be suitable for the mobile equipment, and 30 [Ω·V] (1 V·50 mT) or more is preferable, and 35 [Ω·V] (1 V·50 mT) or more is more preferable.

As for the thickness of the active layer, it is not limited in particular as long as it is thicker than 30 nm and thinner than 100 nm, and preferably thicker than 35 nm and thinner than 100 nm, and more preferably thicker than 40 nm and thinner than 70 nm.

Although the substrate is not limited in particular, GaAs is used. In addition, the buffer layers sandwiching the active layer are composed of Sb and at least two out of five elements Al, Ga, In, As and P. Furthermore, InAs whose sensitivity and temperature characteristics are balanced is selected as the active layer, and AlGaAsSb whose lattice constant is close to that of InAs is selected as the semiconductor thin films formed on and under the active layer. Then AlGaAsSb, InAs and AlGaAsSb are successively formed on the substrate by molecular beam epitaxy (MBE). In some cases, a passivation composed of GaAs can be formed on the outermost surface to prevent oxidation or the like.

In summary, the Hall device suitable for the mobile equipment is composed of the substrate, active layer, buffer layers and passivation. The active layer is composed of an $In_xGa_{1-x}As_ySb_{1-y}$ ($0 \leq x \leq 1$, $0 \leq y \leq 1$) layer with a film thickness greater than 30 nm and less than 100 nm, and is formed on the substrate. The Hall device includes the magneto-sensitive pattern with a multilayer structure in which the active layer is sandwiched between the buffer layers composed of the compound semiconductors.

The reason for this is as follows: If the thickness of the active layer is reduced too much, the variations increase of the electron mobility and sheet resistance due to the Sb composition variations of the buffer layers, thereby hindering the industrial fabrication. On the other hand, when the thickness is increased too much, not only the electron mobility itself is reduced, but also the variations increase of the electron mobility and sheet resistance due to the Sb composition variations of the buffer layers, thereby hindering the industrial fabrication.

Since the Hall device having the multilayer structure enables the characteristic control by varying the compositions of the films, it offers an advantage of enabling the design of an optimum device depending on the application purpose.

As described above, the Hall device composed of the multilayer structure is a Hall device excellent in the total basic characteristics such as the resistance, sensitivity, and temperature characteristics, and is very effective for the mobile equipment. Applying such a Hall device to the device for the mobile equipment enables reduction in the power consumption of the device, and improvement of the design flexibility because of the high sensitivity, thereby leading to the reduction in the cost of the device.

EXAMPLE 1

On a GaAs substrate two inches in diameter, are successively formed by the molecular beam epitaxy (MBE) 600 nm $Al_{0.55}Ga_{0.45}AsSb$ as the first compound semiconductor layer, 50 nm InAs as the active layer, 60 nm $Al_{0.55}Ga_{0.45}AsSb$ as the second compound semiconductor layer, and 6 nm GaAsSb as the third compound semiconductor layer.

The Sb composition was calculated, according to Vegard's law, from accurate lattice constants obtained by a high resolution X-ray diffraction method based on a 4-crystal method using Ge (220) single crystals. The electric characteristics such as the electron mobility were evaluated from the measurement of the Hall effect by van der Pauw method.

Table 2 summarizes the thus obtained lattice constant difference, electron mobility and sheet resistance in accordance with the Sb compositions.

TABLE 2

| Sbx | lattice constant difference (%) | electron mobility (cm$^2$/Vs) | sheet resistance (Ω) |
|---|---|---|---|
| 0.885 | 0.10 | 19112 | 528 |
| 0.902 | 0.23 | 19705 | 477 |
| 0.918 | 0.35 | 20601 | 428 |

TABLE 2-continued

| Sbx | lattice constant difference (%) | electron mobility (cm$^2$/Vs) | sheet resistance (Ω) |
|---|---|---|---|
| 0.929 | 0.43 | 21304 | 399 |
| 0.938 | 0.50 | 21921 | 377 |
| 0.948 | 0.58 | 22545 | 358 |
| 0.952 | 0.61 | 22734 | 352 |
| 0.967 | 0.72 | 23077 | 337 |
| 0.983 | 0.84 | 22464 | 326 |
| 1.000 | 0.99 | 19350 | 291 |
| average | | 21281 | 387 |
| dispersion (±%) | | 9 | 31 |

As seen in Table 2, the electric characteristics are stable even when varying the Sb composition (Sbx=Sb/(Sb+As)) in the first and second compound semiconductor layers in the range of 0.885-1.000. Thus it was confirmed that the effect of the Sb composition variations on the electric characteristics was small. That is, in the wide range of Sbx=0.885-1.00, the electron mobility is in the range of average value ±9%, and the sheet resistance is in the range of average value ±31%.

Although the specifications of the currently available Hall devices are diverse, the resistance is in the range of median value ±40%, and the sensitivity is in the range of median value ±45%, for example. In the present example of the stacked structure, both the electron mobility proportional to the sensitivity and the sheet resistance proportional to the resistance are in these ranges. Thus, the dispersions of these values are considered to be small.

Incidentally, the common industrial fabrication can be operated within the range of median value ±0.04 as to the Sbx. In the range of Sbx=0.902-0.983, the electron mobility is in the range of average value ±8%, and the sheet resistance is in the range of average value ±20%. Thus, it was confirmed that the compound semiconductor stacked structure could be produced industrially at a high yield.

COMPARATIVE EXAMPLE 1

On a GaAs substrate two inches in diameter, are successively formed by the molecular beam epitaxy (MBE) 600 nm $Al_{0.55}Ga_{0.45}AsSb$ as the first compound semiconductor layer, 15 nm InAs as the active layer, 60 nm $Al_{0.55}Ga_{0.45}AsSb$ as the second compound semiconductor layer, and 6 nm GaAsSb as the third compound semiconductor layer.

The Sb composition was calculated, according to Vegard's law, from accurate lattice constants obtained by a high resolution X-ray diffraction method based on the 4-crystal method using Ge (220) single crystals. The electric characteristics such as the electron mobility were evaluated from the measurement of the Hall effect by van der Pauw method.

Table 3 summarizes the thus obtained lattice constant difference, electron mobility and sheet resistance in accordance with the Sb compositions.

TABLE 3

| Sbx | lattice constant difference (%) | electron mobility (cm$^2$/Vs) | sheet resistance (Ω) |
|---|---|---|---|
| 0.890 | 0.140 | 16476 | 1100 |
| 0.901 | 0.220 | 17760 | 905 |
| 0.919 | 0.360 | 20032 | 729 |
| 0.930 | 0.440 | 21137 | 677 |
| 0.939 | 0.510 | 21957 | 581 |
| 0.944 | 0.550 | 22375 | 450 |
| 0.954 | 0.620 | 23067 | 390 |
| 0.967 | 0.720 | 24159 | 298 |
| 0.984 | 0.850 | 26468 | 232 |
| 1.000 | 0.970 | 30631 | 190 |
| average value | | 22406 | 555 |
| dispersion (±%) | | 32 | 82 |

The electric characteristics vary sharply depending on the Sbx variations in the first and second compound semiconductor layers. For example, in the range of Sbx=0.890-1.00, the electron mobility is in the range of average value ±32%, and the sheet resistance is the range of average value ±82%, which deviate sharply from the specifications of the commercially available Hall devices.

The common industrial fabrication can be operated within the range of median value ±0.04 as to the Sbx. However, even in the range of Sbx=0.890-0.967, the electron mobility is in the range of average value ±18%, and the sheet resistance is in the range of average value ±63%. Thus, it is confirmed that the Hall device is difficult to produce industrially.

Figure 17:
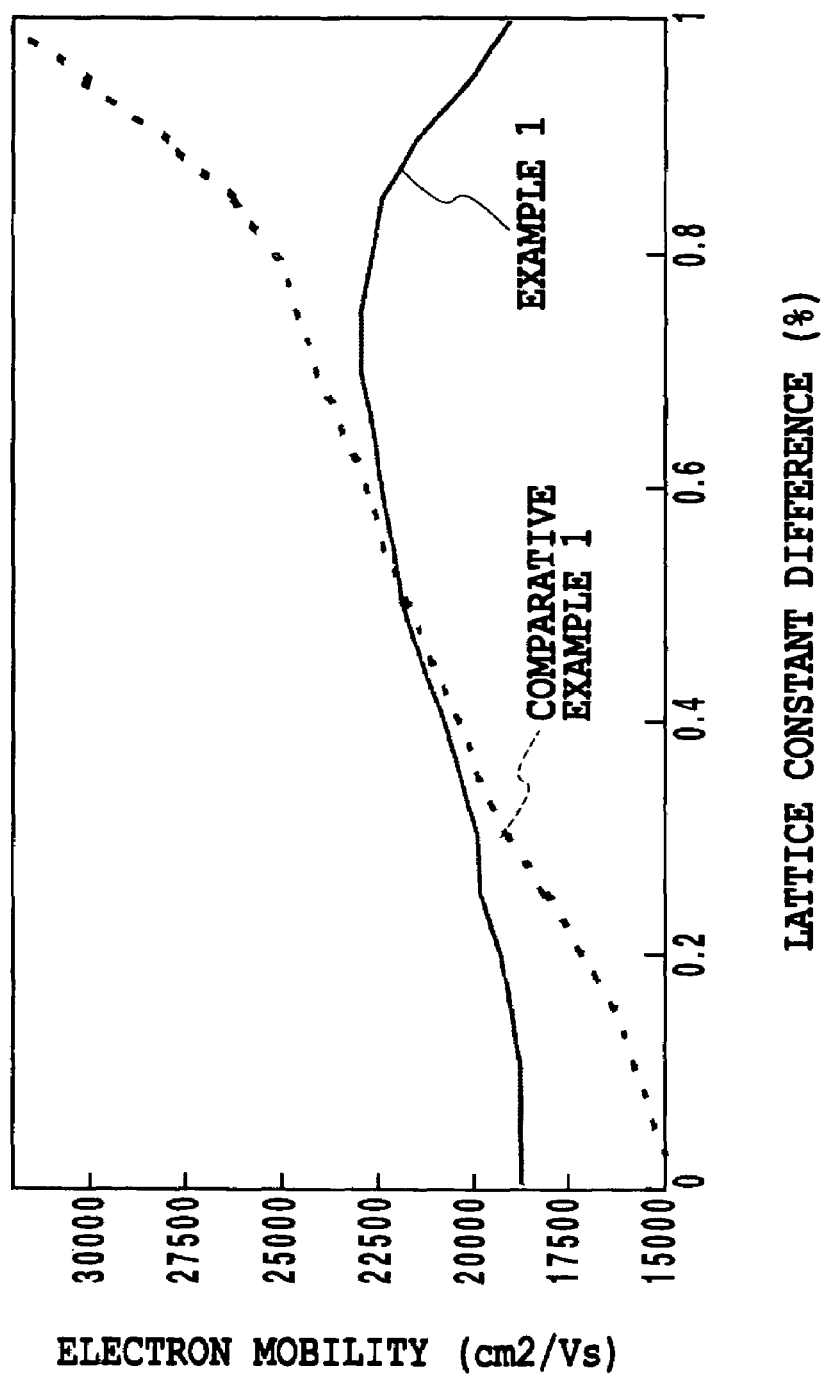
FIG. 17 is a graph illustrating dependence of the electron mobility on the lattice constant difference of a compound semiconductor stacked structure explained in example 1 and comparative example 1.
Figure 18:
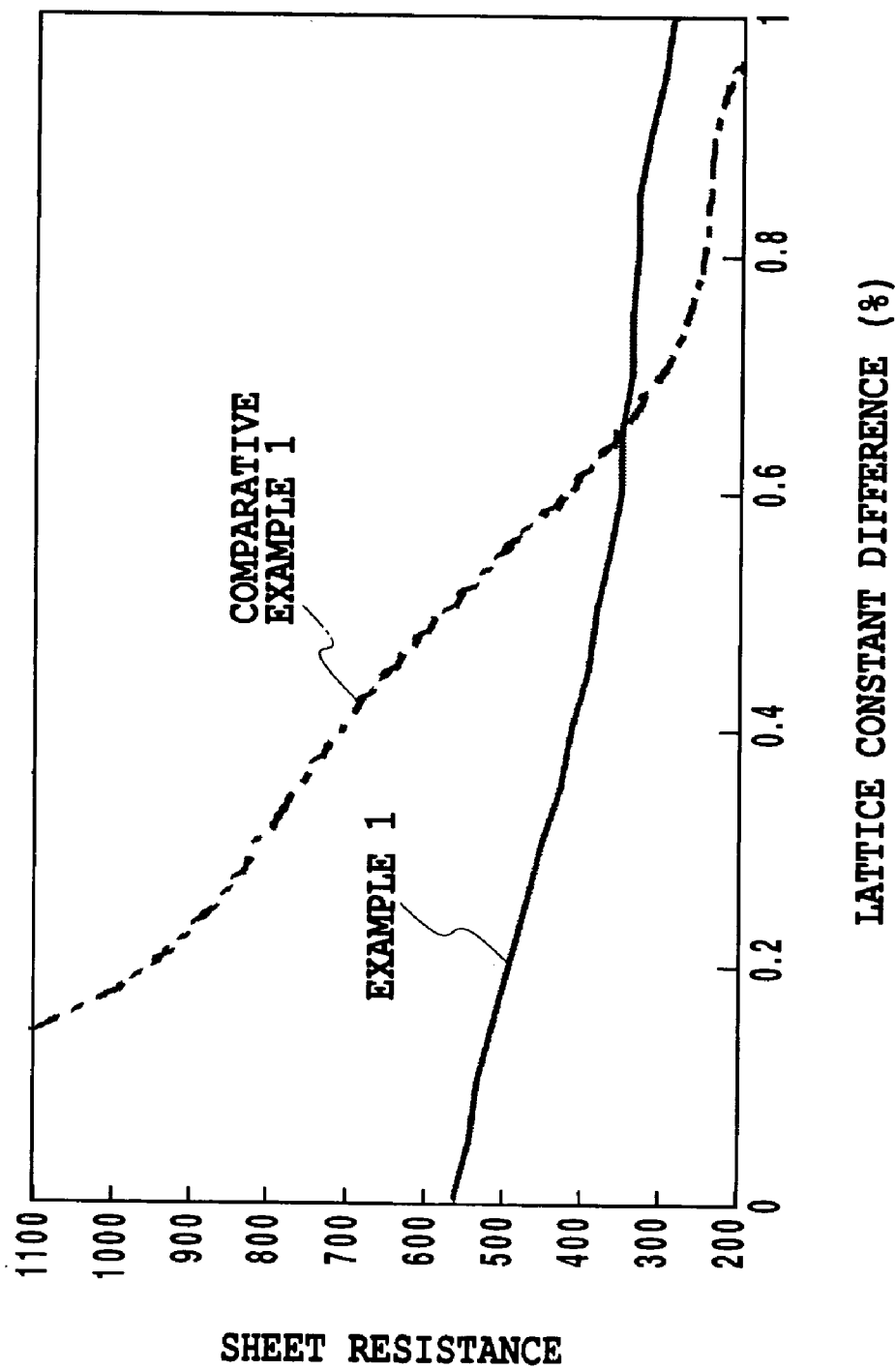
FIG. 18 is a graph illustrating dependence of the sheet resistance on the lattice constant difference of a compound semiconductor stacked structure explained in example 1 and comparative example 1.

FIGS. 17 and 18 are graphs illustrating evaluation results of the dependence of the electron mobility and sheet resistance on the lattice constant difference of the comparative example 1 together with the evaluation results of the example 1. FIG. 17 illustrates the dependence of the electron mobility on the lattice constant difference, and FIG. 18 illustrates the dependence of the sheet resistance on the lattice constant difference.

As seen from these graphs, the variations of the two characteristics for the Sbx variations are small in the example, but are very large in the comparative example 1. In addition, comparing the sheet resistance achieved by the example 1 with the maximum value (280 Ω, 21000 cm$^2$/Vs) disclosed in Japanese Patent Nos. 3069545 and 2793440, the electron mobility is equal to or greater in the wide range of Sbx=0.918-0.983, and the sheet resistance is greater by an amount of 16%-70%. Thus it was confirmed that the example 1 was low power consumption and suitable for the mobile equipment such as mobile phones.

EXAMPLE 2

On a GaAs substrate two inches in diameter, are successively formed by the molecular beam epitaxy (MBE) 600 nm Al$_{0.55}$Ga$_{0.45}$AsSb as the first compound semiconductor layer, 70 nm InAs as the active layer, 60 nm Al$_{0.55}$Ga$_{0.45}$AsSb as the second compound semiconductor layer, and 6 nm GaAsSb as the third compound semiconductor layer.

The Sb composition was calculated, according to Vegard's law, from accurate lattice constants obtained by the high resolution X-ray diffraction method based on the 4-crystal method using Ge (220) single crystals. The electric characteristics such as the electron mobility were evaluated from the measurement of the Hall effect by van der Pauw method.

Table 4 summarizes the thus obtained lattice constant difference, electron mobility and sheet resistance in accordance with the Sb compositions.

TABLE 4

| Sbx | lattice constant difference (%) | electron mobility (cm$^2$/Vs) | sheet resistance (Ω) |
|---|---|---|---|
| 0.886 | 0.11 | 16569 | 535 |
| 0.901 | 0.22 | 17352 | 491 |
| 0.919 | 0.36 | 18809 | 434 |
| 0.937 | 0.49 | 20104 | 390 |
| 0.939 | 0.51 | 20266 | 380 |
| 0.944 | 0.55 | 20544 | 370 |
| 0.951 | 0.60 | 20788 | 360 |
| 0.966 | 0.71 | 20802 | 342 |
| 0.98 | 0.82 | 19889 | 333 |
| 1.000 | 0.96 | 17003 | 312 |
| average value | | 19212 | 395 |
| dispersion (±%) | | 11 | 28 |

From Table 4, it was confirmed that the characteristic variations were small for the Sbx variations. In the wide range of Sbx=0.886-0.999, the electron mobility is in the range of average value ±11%, and the sheet resistance is in the range of average value ±28%. Although the resistance is about median value ±40%, and the sensitivity is about median value ±45% in specifications of the commercially available Hall devices, both the electron mobility proportional to the sensitivity and the sheet resistance proportional to the resistance are in these ranges. Thus, the dispersions of these values are considered to be small.

In the range of Sbx=0.901-0.980, the electron mobility is in the range equal to or less than the average value ±9%, and the sheet resistance is also within the range of average value ±20%. Thus, it was confirmed that the compound semiconductor stacked structure could be produced industrially at a high yield.

EXAMPLE 3

On a GaAs substrate two inches in diameter, are successively formed by the molecular beam epitaxy (MBE) 600 nm Al$_{0.55}$Ga$_{0.45}$AsSb as the first compound semiconductor layer, 35 nm InAs as the active layer, 60 nm Al$_{0.55}$Ga$_{0.45}$AsSb as the second compound semiconductor layer, and 6 nm GaAsSb as the third compound semiconductor layer.

The Sb composition was calculated, according to Vegard's law, from accurate lattice constants obtained by the high resolution X-ray diffraction method based on the 4-crystal method using Ge (220) single crystals. The electric characteristics such as the electron mobility were evaluated from the measurement of the Hall effect by van der Pauw method.

Table 5 summarizes the thus obtained lattice constant difference, electron mobility and sheet resistance in accordance with the Sb compositions.

TABLE 5

| Sbx | lattice constant difference (%) | electron mobility (cm$^2$/Vs) | sheet resistance (Ω) |
|---|---|---|---|
| 0.892 | 0.15 | 19605 | 743 |
| 0.904 | 0.24 | 20518 | 656 |
| 0.918 | 0.35 | 21673 | 590 |
| 0.934 | 0.47 | 22845 | 521 |
| 0.942 | 0.53 | 23372 | 480 |
| 0.948 | 0.58 | 23775 | 450 |
| 0.958 | 0.65 | 24285 | 350 |
| 0.971 | 0.75 | 24909 | 330 |
| 0.980 | 0.82 | 25276 | 320 |
| 1.000 | 1.00 | 25975 | 285 |
| average | | 23223 | 473 |
| dispersion (±%) | | 14 | 48 |

From Table 5, it was confirmed that the characteristic variations were small for the Sbx variations. In the wide range of Sbx=0.892-1.00, the electron mobility is in the range of average value ±14%, and the sheet resistance is in the range of average value ±48%. In specifications of the commercially available Hall devices, the resistance is about median value ±40%, and the sensitivity is about median value ±45%. In the stacked structure of the example 1, although the electron mobility proportional to the sensitivity is within the specifications, the sheet resistance proportional to the resistance slightly exceeds the range of the specifications.

In the range of Sbx=0.904-0.980, the electron mobility is in the range of average value ±10%, and the sheet resistance is also in the range of average value ±36%. Thus, it was confirmed that the compound semiconductor stacked structure could be produced industrially at a high yield.

EXAMPLE 4

On a GaAs substrate two inches in diameter, are successively formed by the molecular beam epitaxy (MBE) 600 nm Al$_{0.55}$Ga$_{0.45}$AsSb as the first compound semiconductor layer, 50 nm InAs as the active layer, 60 nm Al$_{0.55}$Ga$_{0.45}$AsSb as the second compound semiconductor layer, and 6 nm GaAsSb as the third compound semiconductor layer.

The Sb composition was calculated, according to Vegard's law, from accurate lattice constants obtained by the high resolution X-ray diffraction method based on the 4-crystal method using Ge (220) single crystals. The electric characteristics such as the electron mobility were evaluated from the measurement of the Hall effect by van der Pauw method.

Table 6 summarizes the thus obtained lattice constant difference, electron mobility and sheet resistance in accordance with the Sb compositions.

TABLE 6

| Sbx | lattice constant difference (%) | electron mobility (cm$^2$/Vs) | sheet resistance (Ω) |
|---|---|---|---|
| 0.888 | 0.12 | 19173 | 409 |
| 0.897 | 0.19 | 19475 | 393 |
| 0.914 | 0.32 | 20353 | 366 |
| 0.930 | 0.44 | 21393 | 340 |
| 0.940 | 0.52 | 22089 | 321 |
| 0.952 | 0.61 | 22734 | 300 |
| 0.960 | 0.67 | 23002 | 287 |
| 0.970 | 0.74 | 23060 | 272 |
| 0.984 | 0.85 | 22349 | 251 |
| 1.000 | 0.99 | 19350 | 222 |
| average value | | 21298 | 316 |
| dispersion (±%) | | 9 | 30 |

From Table 6, it was confirmed that the characteristic variations were small for the Sbx variations. In the wide range of Sbx=0.888-1.00, the electron mobility is in the range of average value ±9%, and the sheet resistance is in the range of average value ±30%. In specifications of the commercially available Hall devices, the resistance is about median value ±40%, and the sensitivity is about median value ±45%. Thus, both the electron mobility proportional to the sensitivity and the sheet resistance proportional to the resistance are within the specifications, and their variations are considered to be small.

In the range of Sbx=0.897-0.984, the electron mobility is in the range equal to or less than the average value ±8%, and the sheet resistance is also within the range of average value ±22%. Thus, it was confirmed that the compound semiconductor stacked structure could be produced industrially at a high yield.

EXAMPLE 5

On a GaAs substrate two inches in diameter, are successively formed by the molecular beam epitaxy (MBE) 600 nm Al$_{0.65}$Ga$_{0.35}$AsSb as the first compound semiconductor layer, 50 nm InAs as the active layer, 60 nm Al$_{0.65}$Ga$_{0.35}$AsSb as the second compound semiconductor layer, and 6 nm GaAsSb as the third compound semiconductor layer.

The Sb composition was calculated, according to Vegard's law, from accurate lattice constants obtained by the high resolution X-ray diffraction method based on the 4-crystal method using Ge (220) single crystals. The electric characteristics such as the electron mobility were evaluated from the measurement of the Hall effect by van der Pauw method.

Table 7 summarizes the thus obtained lattice constant difference, electron mobility and sheet resistance in accordance with the Sb compositions.

TABLE 7

| Sbx | lattice constant difference (% | electron mobility (cm$^2$/Vs) | sheet resistance (Ω) |
|---|---|---|---|
| 0.886 | 0.11 | 19141 | 672 |
| 0.892 | 0.15 | 19286 | 652 |
| 0.902 | 0.23 | 19705 | 611 |
| 0.913 | 0.31 | 20274 | 569 |
| 0.927 | 0.42 | 21214 | 514 |
| 0.939 | 0.51 | 22006 | 473 |
| 0.954 | 0.62 | 22790 | 432 |

TABLE 7-continued

| Sbx | lattice constant difference (%) | electron mobility (cm$^2$/Vs) | sheet resistance (Ω) |
|---|---|---|---|
| 0.966 | 0.71 | 23075 | 406 |
| 0.988 | 0.88 | 21934 | 367 |
| 1.000 | 1.00 | 19053 | 326 |
| average value | | 20848 | 502 |
| dispersion (±%) | | 10 | 34 |

From Table 7, it was confirmed that the characteristic variations were small for the Sbx variations. In the wide range of Sbx=0.886-1.00, the electron mobility is in the range of average value ±10%, and the sheet resistance is in the range of average value ±34%. In specifications of the commercially available Hall devices, the resistance is about median value ±40%, and the sensitivity is about median value ±45%. Thus, both the electron mobility proportional to the sensitivity and the sheet resistance proportional to the resistance are within the ranges, and their variations are considered to be small.

In the range of Sbx=0.902-0.988, the electron mobility is in the range equal to or less than the average value ±8%, and the sheet resistance is also within the range of average value ±28% Thus, it was confirmed that the compound semiconductor stacked structure could be produced industrially at a high yield.

EXAMPLE 6

On a GaAs substrate two inches in diameter, are successively formed by the molecular beam epitaxy (MBE) 600 nm Al$_{0.65}$Ga$_{0.35}$AsSb as the first compound semiconductor layer, 50 nm In$_{0.97}$Ga$_{0.03}$As$_{0.98}$Sb$_{0.02}$ as the active layer, 60 nm Al$_{0.65}$Ga$_{0.35}$AsSb as the second compound semiconductor layer, and 6 nm GaAsSb as the third compound semiconductor layer.

The Sb composition was calculated, according to Vegard's law, from accurate lattice constants obtained by the high resolution X-ray diffraction method based on the 4-crystal method using Ge (220) single crystals. The electric characteristics such as the electron mobility were evaluated from the measurement of the Hall effect by van der Pauw method.

Table 8 summarizes the thus obtained lattice constant difference, electron mobility and sheet resistance in accordance with the Sb compositions.

TABLE 8

| Sbx | lattice constant difference (%) | electron mobility (cm$^2$/Vs) | sheet resistance (Ω) |
|---|---|---|---|
| 0.905 | 0.25 | 19835 | 610 |
| 0.910 | 0.29 | 20120 | 592 |
| 0.911 | 0.30 | 20196 | 583 |
| 0.913 | 0.35 | 20601 | 556 |
| 0.926 | 0.41 | 21125 | 527 |
| 0.940 | 0.52 | 22089 | 483 |
| 0.959 | 0.66 | 22969 | 427 |
| 0.966 | 0.71 | 23075 | 411 |
| 0.980 | 0.82 | 22661 | 387 |
| 0.992 | 0.91 | 21404 | 365 |
| average | | 21407 | 494 |
| dispersion (±%) | | 8 | 25 |

From Table 8, it was confirmed that the characteristic variations were small for the Sbx variations. In the wide range of Sbx=0.905-0.992, the electron mobility is in the range of average value ±8%, and the sheet resistance is in the range of average value ±25%. In specifications of the commercially available Hall devices, the resistance is about median value ±40%, and the sensitivity is about median value ±45%. Thus, both the electron mobility proportional to the sensitivity and the sheet resistance proportional to the resistance are within the ranges, and their variations are considered to be small.

In the range of Sbx=0.905-0.980, the electron mobility is in the range equal to or less than the average value ±8%, and the sheet resistance is also within the range of average value ±22%. Thus, it was confirmed that the compound semiconductor stacked structure could be produced industrially at a high yield.

EXAMPLE 7

Next, a Hall device, a magnetic sensor like that of FIG. 4, was formed on the stacked substrate formed in the example 1 using photolithography, and the Hall device characteristics were measured. The electrodes were formed by continuously evaporating a 100 nm thick Ti layer and a 600 nm thick Au layer by vacuum evaporation. The chip size of the Hall device is 360 μm×360 μm, and the magneto-sensitive pattern is 95 μm long (the length across the opposing electrodes) and 35 μm wide. The Hall device was supplied with an input voltage of 3 V in the magnetic field of 50 mT to measure its sensitivity. The measurement was carried out for the device at the center of the substrate.

Table 9 summarizes the thus measured sensitivity and input resistance in accordance with the lattice constant differences.

TABLE 9

| Sbx | lattice constant difference (%) | sensitivity (3 V, 50 mT) | input resistance (Ω) |
|---|---|---|---|
| 0.885 | 0.10 | 102 | 1250 |
| 0.902 | 0.23 | 103 | 1090 |
| 0.918 | 0.35 | 107 | 980 |
| 0.929 | 0.43 | 111 | 910 |
| 0.938 | 0.50 | 114 | 870 |
| 0.948 | 0.58 | 117 | 820 |
| 0.952 | 0.61 | 118 | 800 |
| 0.967 | 0.72 | 125 | 780 |
| 0.983 | 0.84 | 117 | 760 |
| 1.000 | 0.99 | 100 | 650 |
| average value | | 111 | 891 |
| dispersion (±%) | | 11 | 34 |

As seen from Table 9, the sensitivity is 111 mV and the input resistance is 891 ohms in the averages in the range of Sbx=0.885-1.00. The sensitivity is more than twice that of the Hall devices using common GaAs, and the device resistance is higher than that of Japanese Patent No. 2793440. Thus, it was confirmed that the Hall device was highly sensitive and low in power consumption. As for the temperature characteristics, it was confirmed that the Hall device was equivalent to the device disclosed in Japanese Patent No. 2793440.

The dispersion of the sensitivity is in the range of average value ±11%, and the sheet resistance is in the range of average value ±34%. In specifications of the commercially available Hall devices, the resistance is about median value ±40%, and the sensitivity is about median value ±45%. Thus, both the electron mobility proportional to the sensitivity and the sheet resistance proportional to the resistance are within the ranges, and their variations are considered to be small.

In the range of Sbx=0.902-0.983, the electron mobility is in the range of average value ±7%, and the sheet resistance is also within the range of average value ±19%. Thus, it was confirmed that the quantum well Hall sensor could be produced industrially at a high yield. In addition, it was confirmed that the magnetic sensor of the present example is low in power consumption, and hence suitable for the mobile equipment such as mobile phones application purpose.

COMPARATIVE EXAMPLE 2

Table 10 summarizes the measured results of the characteristics of a Hall device that was formed in the same manner as the example 7 using the stacked structure formed in the comparative example 1. The measurement was carried out under the same conditions as the example 7.

TABLE 10

| Sbx | lattice constant difference (%) | sensitivity (3 V, 50 mT) | input resistance (Ω) |
| --- | --- | --- | --- |
| 0.890 | 0.14 | 80 | 2550 |
| 0.901 | 0.22 | 84 | 2060 |
| 0.919 | 0.36 | 106 | 1700 |
| 0.930 | 0.44 | 109 | 1550 |
| 0.939 | 0.51 | 115 | 1330 |
| 0.944 | 0.55 | 117 | 1030 |
| 0.954 | 0.61 | 121 | 890 |
| 0.967 | 0.72 | 125 | 680 |
| 0.984 | 0.85 | 138 | 540 |
| 1.000 | 0.97 | 160 | 400 |
| average value | | 116 | 1273 |
| dispersion (±%) | | 35 | 84 |

As seen from Table 10, the average value of the sensitivity is 116 mV and the average value of the input resistance is 1273 ohms in the range of Sbx=0.890-1.00. The dispersion of the sensitivity is in the range of average ±35%, and the dispersion of the input resistance is in the range of average value ±84%, which deviate sharply from the specifications of the commercially available Hall devices.

The common industrial fabrication can be operated within the range of median value ±0.04 as to the Sbx. Thus, even in the range of Sbx=0.888-0.967, the sensitivity is in the range of average value ±24%, and the input resistance is in the range of average value ±62%, which confirms that the industrial production is difficult. Incidentally, the resistance distribution and sensitivity distribution in the surface exhibits negative tendencies as compared with those of the example 7.

EXAMPLE 8

Table 11 summarizes the measured results (sensitivity and input resistance, and their dispersions) of the characteristics of a Hall device that was formed in the same manner as the example 7 using the stacked structure formed in the examples 2-6. The measurement was carried out under the same conditions as the example 7.

TABLE 11

| example | sensitivity (mV) | dispersion (%) | input resistance (Ω) | dispersion (%) | Sbx range |
| --- | --- | --- | --- | --- | --- |
| 2 | 101 | 12 | 911 | 30 | 0.886-0.999 |
| 3 | 121 | 16 | 1090 | 51 | 0.904-0.980 |
| 4 | 112 | 11 | 735 | 32 | 0.888-1.000 |
| 5 | 110 | 12 | 1151 | 36 | 0.886-1.000 |
| 6 | 112 | 10 | 1118 | 27 | 0.905-0.992 |

All these Hall devices substantially satisfy the specifications of the commercially available Hall devices, and it was confirmed that the quantum well Hall sensors could be produced industrially at high yields. In addition, it was confirmed that the sensitivity of these devices was more than twice that of the Hall devices using common GaAs, and that the devices were highly sensitive, low power consumption devices.

EXAMPLE 9

On a GaAs substrate two inches in diameter, are successively formed by the molecular beam epitaxy (MBE) 600 nm $Al_{0.55}Ga_{0.45}AsSb$ as the first compound semiconductor layer, 50 nm InAs as the active layer, 60 nm $Al_{0.55}Ga_{0.45}AsSb$ as the second compound semiconductor layer, and 6 nm GaAsSb as the third compound semiconductor layer.

The Sb composition was calculated, according to Vegard's law, from accurate lattice constants obtained by the high resolution X-ray diffraction method based on the 4-crystal method using Ge (220) single crystals. The electric characteristics such as the electron mobility were evaluated from the measurement of the Hall effect by van der Pauw method.

Table 12 summarizes the thus obtained lattice constant difference, electron mobility and sheet resistance in accordance with the Sb compositions.

TABLE 12

| Sbx | lattice constant difference (%) | electron mobility (cm$^2$/Vs) | sheet resistance (Ω) |
| --- | --- | --- | --- |
| 0.886 | 0.11 | 19141 | 538 |
| 0.904 | 0.24 | 19769 | 484 |
| 0.917 | 0.34 | 20517 | 444 |
| 0.930 | 0.44 | 21393 | 406 |
| 0.939 | 0.51 | 22006 | 385 |
| 0.947 | 0.57 | 22475 | 371 |
| 0.954 | 0.62 | 22790 | 360 |
| 0.968 | 0.73 | 23072 | 341 |
| 0.984 | 0.85 | 22349 | 329 |
| 1.000 | 0.99 | 19350 | 296 |

TABLE 12-continued

| Sbx | lattice constant difference (%) | electron mobility (cm$^2$/Vs) | sheet resistance (Ω) |
|---|---|---|---|
| average value | | 21286 | 395 |
| dispersion (±%) | | 9 | 31 |

From Table 12, it was confirmed that the characteristic variations were small for the Sbx variations in the first and second compound semiconductor layers. In the wide range of Sbx=0.886-1.00, the electron mobility is in the range of average value ±9%, and the sheet resistance is in the range of average value ±31%. Thus, the dispersions of both the electron mobility proportional to the sensitivity and the sheet resistance proportional to the resistance are within the dispersions of the sensitivity and input resistance of the commercially available Hall devices, and the variations are considered to be small.

The common industrial fabrication can be operated within the range of median value ±0.04 as to the Sbx. In the range of Sbx=0.904-0.984, the electron mobility is in the range of average value ±8%, and the sheet resistance is in the range of average value ±20%. Thus, it was confirmed that the compound semiconductor stacked structure could be produced industrially at a high yield, and that the results were obtained which were equivalent to the stacked structure having its third compound semiconductor layer composed of GaAsSb.

EXAMPLE 10

Table 13 summarizes the measured results of the characteristics of a Hall device as in the example 7 after fabricating a magnetic sensor (the Hall device) as shown in FIG. 4 using the photolithography.

TABLE 13

| Sbx | lattice constant difference (%) | sensitivity (3 V, 50 mT) | input resistance (Ω) |
|---|---|---|---|
| 0.885 | 0.10 | 102 | 1240 |
| 0.902 | 0.23 | 103 | 1100 |
| 0.918 | 0.35 | 107 | 990 |
| 0.929 | 0.43 | 111 | 920 |
| 0.938 | 0.50 | 114 | 880 |
| 0.948 | 0.58 | 117 | 830 |
| 0.952 | 0.61 | 118 | 810 |
| 0.967 | 0.72 | 122 | 790 |
| 0.983 | 0.84 | 117 | 750 |
| 1.000 | 0.99 | 102 | 660 |
| average value | | 111 | 897 |
| dispersion (±%) | | 9 | 32 |

As seen from Table 13, the sensitivity is 111 mV and the input resistance is 897 ohms in the averages in the range of Sbx=0.886-1.00. The sensitivity is more than twice that of the Hall devices using common GaAs. Thus, it was confirmed that the Hall device was highly sensitive and low in power consumption.

The dispersion of the sensitivity is in the range of average value ±9%, and the sheet resistance is in the range of average value ±32%. The results are better than the case where the third compound semiconductor layer is composed of GaAsSb (example 7). In specifications of the commercially available Hall devices, the resistance is about median value ±40%, and the sensitivity is about median value ±45%. Thus, both the electron mobility proportional to the sensitivity and the sheet resistance proportional to the resistance are within the ranges, and their variations are considered to be small.

Incidentally, the common industrial fabrication can be operated within the range of median value ±0.04 as to the Sbx. Thus, in the range of Sbx=0.902-0.983, the electron mobility is in the range of average value ±8%, and the sheet resistance is in the range of average value ±20%. Thus, it was confirmed that the dispersions were smaller than when the third compound semiconductor layer was composed of GaAsSb, and that the quantum well Hall sensor could be produced industrially at high yields.

EXAMPLE 11

The compound semiconductor Hall device as shown in FIG. 4 was fabricated by the following process.

First, the fabrication process of the semiconductor thin films will be described.

The semiconductor thin films were formed by successively forming the following compound semiconductor layers on the GaAs substrate two inches in diameter by the molecular beam epitaxy (MBE): 500 nm $Al_{0.57}Ga_{0.43}As_{0.04}Sb_{0.96}$ as the first compound semiconductor layer; 50 nm InAs as the active layer; 50 nm $Al_{0.57}Ga_{0.43}As_{0.04}Sb_{0.96}$ as the second compound semiconductor layer; and 5 nm $GaAs_{0.02}Sb_{0.98}$ as the third compound semiconductor layer.

The band gap of $Al_{0.57}Ga_{0.43}As_{0.04}Sb_{0.96}$ is about 1.2 eV, which is sufficiently greater than 0.36 eV of InAs. The electric characteristics of the semiconductor thin film were measured using the van der Pauw method. The results were: the electron mobility was 22000 cm$^2$/Vs, the sheet resistance was 360 Ω, and the sheet electron concentration was 7.9× 10$^{11}$ cm$^{-2}$.

Next, the wafer process will be described.

First, a resist pattern for exposing the InAs layer was formed using the photolithography. Etching of unnecessary portions of the $GaAs_{0.02}Sb_{0.98}$ layer and $Al_{0.57}Ga_{0.43}As_{0.04}Sb_{0.96}$ layer was performed subsequent to the resist development using an alkaline resist developer, followed by removing the resist. Since the developer did not etch the InAs layer, the etching was stopped on the surface of the InAs layer.

Subsequently, a resist pattern with a shape of the magneto-sensitive pattern was formed. Using it as a mask, the magneto-sensitive pattern was formed by performing the mesa etching down to the GaAs substrate by ion milling, followed by removing the resist. Subsequently, 300 nm $Si_3N_4$ was formed on the entire surface of the wafer as the passivation using plasma CVD. On the $Si_3N_4$ layer, a resist pattern was formed having openings at the regions where the metal electrode layer makes contact with the InAs layer and at the pad portions. Then, unnecessary portions of the $Si_3N_4$ layer were etched by the reactive ion etching using the mixed gas of $CF_4$ and $O_2$.

Subsequently, the resist was removed, followed by continuous evaporation of the 100 nm Ti layer and 600 nm Au layer by the vacuum evaporation method, and the pattern of the metal electrode layer was formed by the common lift off method. Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 µm long (length across the opposing electrodes) and 35 µm wide. The sensitivity of the Hall device was measured by applying the input voltage of 3 V in the magnetic field of 50 mT, resulting in the output voltage of 120 mV.

Figure 19A:
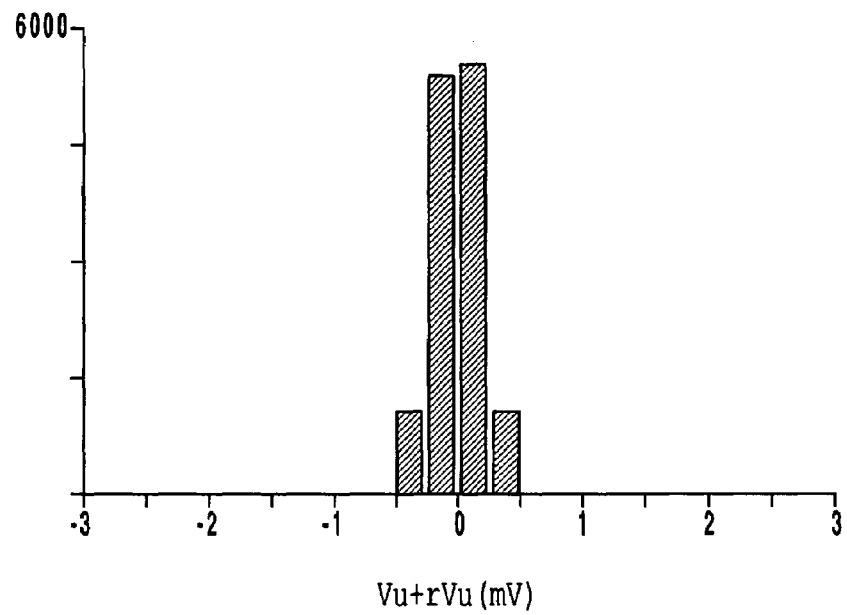

As for the 13500 Hall devices fabricated in the wafer, the input resistance Rin, unbalanced voltage Vu and 90° rotated unbalanced voltage rVu were measured with an auto prober (automatic measuring instrument). The measurement of the Rin was performed at the input current of 0.1 mA, and the measurement of the Vu and rVu was performed at the input voltage of 3 V. The average value of the Rin was 820 Ω. In addition, the Vu+rVu variations have the distribution as illustrated in FIG. 19A, in which σ=0.18 mV, which is rather small, and no device exceeds 0.5 mV.

COMPARATIVE EXAMPLE 3

Figure 1:
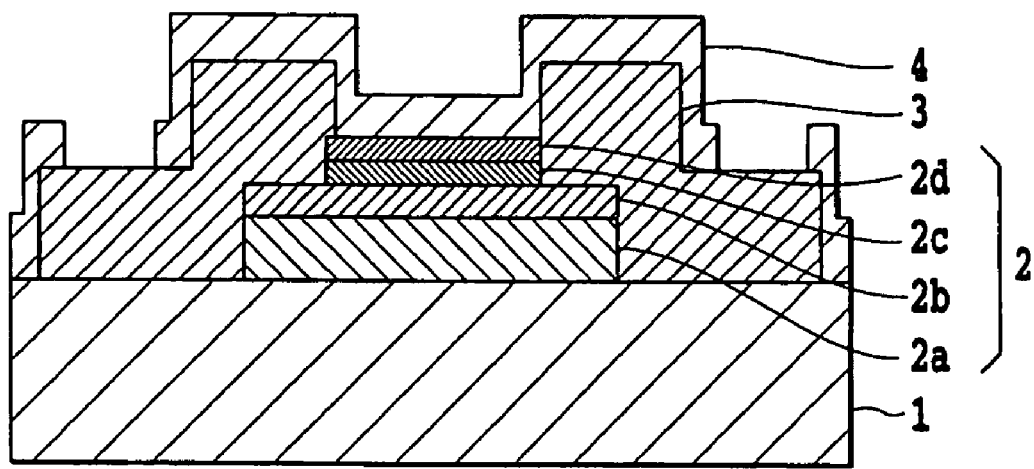
FIG. 1 is a cross-sectional view of a compound semiconductor Hall device with a conventional structure.

The conventional compound semiconductor Hall device as shown in FIG. 1 was fabricated by the following process. As for the layer structure of the semiconductor thin films and their fabrication process are the same as those of the foregoing example 1. The steps of the wafer process will be described below.

First, a resist pattern with a shape of the magneto-sensitive pattern was formed by the photolithography. Using it as a mask, the magneto-sensitive pattern was formed by performing the mesa etching down to the GaAs substrate by ion milling, followed by removing the resist.

Subsequently, a resist pattern for exposing the InAs layer was formed using the photolithography. Etching of unnecessary portions of the $GaAs_{0.02}Sb_{0.98}$ layer and $Al_{0.57}Ga_{0.43}As_{0.04}Sb_{0.96}$ layer was performed subsequent to the resist development using an alkaline resist developer, followed by removing the resist. Since the developer did not etch the InAs layer, the etching was stopped on the surface of the InAs layer.

Subsequently, the 100 nm Ti layer and 600 nm Au layer were continuously evaporated by the vacuum evaporation method, and the pattern of the metal electrode layer was formed by the common lift off method. After that, 300 nm $Si_3N_4$ was formed on the entire surface of the wafer as the passivation using plasma CVD. On the $Si_3N_4$ layer, a resist pattern was formed having openings at the pad portions. Then, unnecessary portions of the $Si_3N_4$ layer were etched by the reactive ion etching using the mixed gas of $CF_4$ and $O_2$. After removing the resist, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 µm long (length across the opposing electrodes) and 35 µm wide. The sensitivity was 120 mV equal to that of the embodiment 1.

Figure 19B:
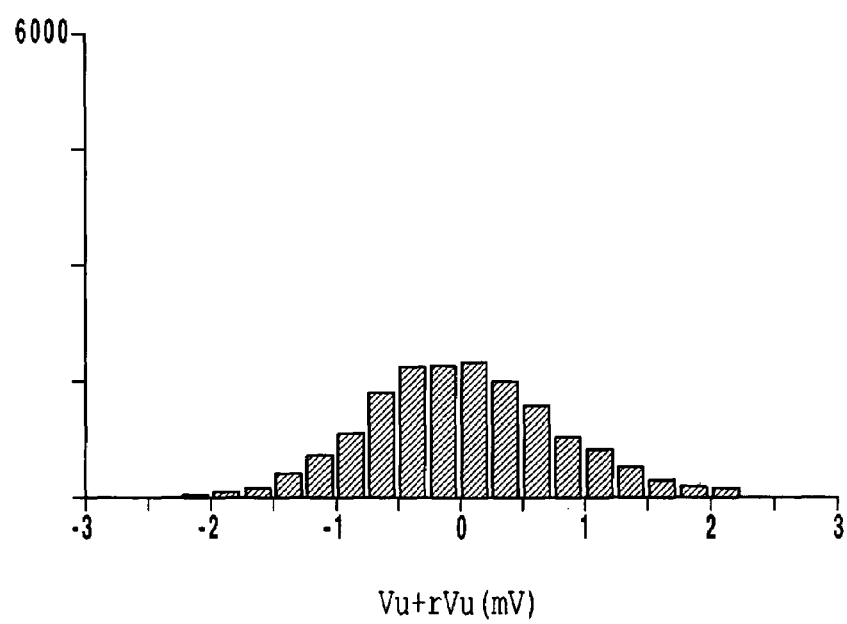

As for the 13500 Hall devices fabricated in the wafer, the input resistance Rin, unbalanced voltage Vu and 90° rotated unbalanced voltage rVu were measured in the same manner as in the example 1. The average value of the Rin was 820 Ω equal to that of the example 1. The Vu+rVu variations has the distribution as illustrated in FIG. 19B, in which σ=0.76 mV, much greater that of the example 11, and many devices exceed 0.5 mV.

EXAMPLE 12

The compound semiconductor Hall device as shown in FIG. 4 was fabricated which had the semiconductor thin films with different layer structure from that of the example 11. Its fabrication process will be described below.

First, the fabrication process of the semiconductor thin films will be described.

The semiconductor thin films were formed by successively forming the following compound semiconductor layers on the GaAs substrate two inches in diameter by the molecular beam epitaxy (MBE): 500 nm $Al_{0.50}Ga_{0.50}As$ as the first compound semiconductor layer; 50 nm $In_{0.05}Ga_{0.95}As$ as the active layer; 50 nm $Al_{0.50}Ga_{0.50}As$ as the second compound semiconductor layer; and 10 nm GaAs as the third compound semiconductor layer.

As for the $Al_{0.50}Ga_{0.50}As$ of the second compound semiconductor layer, a 10 nm thickness from the active layer was made a non-doped layer, and the third compound semiconductor layer side 40 nm was made a Si-doped layer. The band gap of $Al_{0.50}Ga_{0.50}As$ is about 1.8 eV, which is sufficiently greater than 1.4 eV of $In_{0.05}Ga_{0.95}As$. The electric characteristics of the semiconductor thin films were measured using the van der Pauw method. The results were: the electron mobility was 7500 $cm^2/Vs$, the sheet resistance was 1200 Ω, and the sheet electron concentration was $7.0 \times 10^{11}$ $cm^{-2}$.

Next, the wafer process will be described.

First, a resist pattern for exposing the $In_{0.05}Ga_{0.95}As$ layer was formed using the photolithography. Etching of unnecessary portions of the GaAs layer and $Al_{0.50}Ga_{0.50}As$ layer was carried out by the ion milling, and the etching was quit halfway through the $In_{0.05}Ga_{0.95}As$ layer, followed by removing the resist.

Subsequently, a resist pattern with a shape of the magneto-sensitive pattern was formed. Using it as a mask, the magneto-sensitive pattern was formed by performing the mesa etching down to the GaAs substrate by ion milling, followed by removing the resist. Subsequently, 300 nm $Si_3N_4$ was formed on the entire surface of the wafer as the passivation using plasma CVD. On the $Si_3N_4$ layer, a resist pattern was formed having openings at the regions where the metal electrode layer makes contact with the $In_{0.05}Ga_{0.95}As$ layer and at the pad portions. Then, unnecessary portions of the $Si_3N_4$ layer were etched by the reactive ion etching using the mixed gas of $CF_4$ and $O_2$.

Subsequently, the resist was removed, followed by continuous evaporation of the 250 nm AuGe layer, 50 nm Ni layer and 350 nm Au layer by the vacuum evaporation method, and the pattern of the metal electrode layer was formed by the common lift off method. Finally, the wafer was subjected to 400° C., five minute annealing in an $N_2$ atmosphere, thereby fabricating the compound semiconductor Hall devices.

A lot of compound semiconductor Hall devices fabricated on the wafer by the foregoing method each have the magneto-sensitive pattern of 80 µm long (length across the opposing electrodes) and 40 µm wide. The sensitivity of the Hall device was measured by applying the input voltage of 3 V in the magnetic field of 50 mT, resulting in the output voltage of 50 mV.

As for the 13500 Hall devices fabricated in the wafer, the input resistance Rin, unbalanced voltage Vu and 90° rotated unbalanced voltage rVu were measured in the same manner as in the example 11. The average value of the Rin was 2000

Ω. In addition, the Vu+rVu variations have the distribution of σ=0.15 mV, which is rather small, and no device exceeds 0.5 mV.

COMPARATIVE EXAMPLE 4

The compound semiconductor Hall device as shown in FIG. 1 was fabricated which had the same layer structure as the semiconductor thin films of the foregoing example 12. The fabrication process will be described. The fabrication process of the semiconductor thin films is the same as that of the foregoing example 12. The steps of the wafer process will be described below.

First, a resist pattern with a shape of the magneto-sensitive pattern was formed by the photolithography. Using it as a mask, the magneto-sensitive pattern was formed by performing the mesa etching down to the GaAs substrate by ion milling, followed by removing the resist. Subsequently, a resist pattern for exposing the $In_{0.05}Ga_{0.95}As$ layer was formed using the photolithography. Etching of unnecessary portions of the GaAs layer and $Al_{0.50}Ga_{0.50}As$ layer was performed by ion milling, and the etching was quit halfway through the $In_{0.05}Ga_{0.95}As$ layer. Subsequently, the resist was removed.

Subsequently, continuous evaporation of the 250 nm AuGe layer, 50 nm Ni layer and 350 nm Au layer was performed by the vacuum evaporation method, and the pattern of the metal electrode layer was formed by the common lift off method. Then, the wafer was subjected to 400° C., five minute annealing in an $N_2$ atmosphere, followed by forming 300 nm $Si_3N_4$ on the entire surface of the wafer as the passivation using the plasma CVD. On the $Si_3N_4$ layer, a resist pattern was formed having openings at the pad portions. Then, unnecessary portions of the $Si_3N_4$ layer were etched by the reactive ion etching using the mixed gas of $CF_4$ and $O_2$, followed by removing the resist finally.

A lot of compound semiconductor Hall devices fabricated on the wafer by the foregoing method each have the magneto-sensitive pattern of 80 μm long (length across the opposing electrodes) and 40 μm wide. The sensitivity was 50 mV equal to that of the example 2.

As for the 13500 Hall devices fabricated in the wafer, the input resistance Rin, unbalanced voltage Vu and 90° rotated unbalanced voltage rVu were measured in the same manner as in the example 11. The average value of the Rin was 2000 Ω equal to that of the example 12. In addition, the Vu+rVu variations were σ=0.30 mV, which is rather large compared with that of the example 12, and the devices whose Vu+rVu variations exceed 0.5 mV were confirmed.

EXAMPLE 13

The compound semiconductor Hall device as shown in FIG. 4 was fabricated by the following process.

First, the fabrication process of the semiconductor thin films will be described. The semiconductor thin films were formed by successively forming the following compound semiconductor layers on the GaAs substrate two inches in diameter by the molecular beam epitaxy (MBE): 500 nm $Al_{0.57}Ga_{0.43}As_{0.04}Sb_{0.96}$ as the first compound semiconductor layer; 50 nm InAs as the active layer; 50 nm $Al_{0.57}Ga_{0.43}As_{0.04}Sb_{0.96}$ as the second compound semiconductor layer; and 10 nm $GaAs_{0.02}Sb_{0.98}$ as the third compound semiconductor layer.

The band gap of $Al_{0.57}Ga_{0.43}As_{0.04}Sb_{0.96}$ is about 1.2 eV, which is sufficiently greater than 0.36 eV of InAs. The electric characteristics of the semiconductor thin films were measured using the van der Pauw method. The results were: the electron mobility was 22000 $cm^2/Vs$, the sheet resistance was 360 Ω, and the sheet electron concentration was $7.9 \times 10^{11}$ $cm^{-2}$.

Next, the wafer process will be described with reference to the flowchart of FIG. 6.

First, a resist pattern with a shape of the magneto-sensitive pattern (including electrode contact portions) was formed (S601). Using it as a mask, the magneto-sensitive pattern was formed by performing the mesa etching down to the GaAs substrate by ion milling (S602), followed by removing the resist (S603).

Subsequently, a resist pattern having openings slightly larger than the regions at which the metal electrode layer makes contact with the InAs layer was formed on the semiconductor thin film (S604). Then, unnecessary portions of the $GaAs_{0.02}Sb_{0.98}$ layer and $Al_{0.57}Ga_{0.43}As_{0.04}Sb_{0.96}$ layer were etched with HCl based etchant (S605), followed by removing the resist (S606). Since the etchant did not etch the InAs layer, the etching stopped on the surface of the InAs layer.

Subsequently, 300 nm $Si_3N_4$ was formed on the entire surface of the wafer as the passivation using plasma CVD (S607). On the $Si_3N_4$ layer, a resist pattern was formed having openings at the regions where the metal electrode layer makes contact with the InAs layer and at the pad portions (S608). Then, unnecessary portions of the $Si_3N_4$ layer were etched by the reactive ion etching using the mixed gas of $CF_4$ and $O_2$ (S609). Subsequently, the resist was removed (S610), followed by continuous evaporation of the 100 nm Ti layer and 600 nm Au layer by the vacuum evaporation method, and the pattern of the metal electrode layer was formed by the common lift off method (S611 and S612). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the Hall device was left in a high temperature, high moisture environment (121° C., 99% and 2 atmospheres) for 100 hours, and the unbalanced voltage variations ΔVu (mV) were measured before and after that. Furthermore, the Hall devices were dipped in a soldering bath heated at 350° C. for five seconds, and the unbalanced voltage variations ΔVu (mV) and input resistance variations ΔRin (%) (obtained by dividing the resistance variations by the resistance value before the dip) before and after the dip. The measurement of Rin was carried out at the input current of 0.1 mA, and the measurement of Vu was performed at the input voltage of 3 V. Measured results of 50 devices were evaluated by standard deviations for ΔVu, and by average values for ΔRin, and the results are shown in the following Table 14. All the values were smaller than those of comparative examples that will be described later. In particular, ΔVu in the high temperature, high moisture test was greatly improved, which was the effect resulting from covering the entire device other than the active layer, which makes contact with the metal electrode layer, directly with the passivation.

TABLE 14

Figure 2:
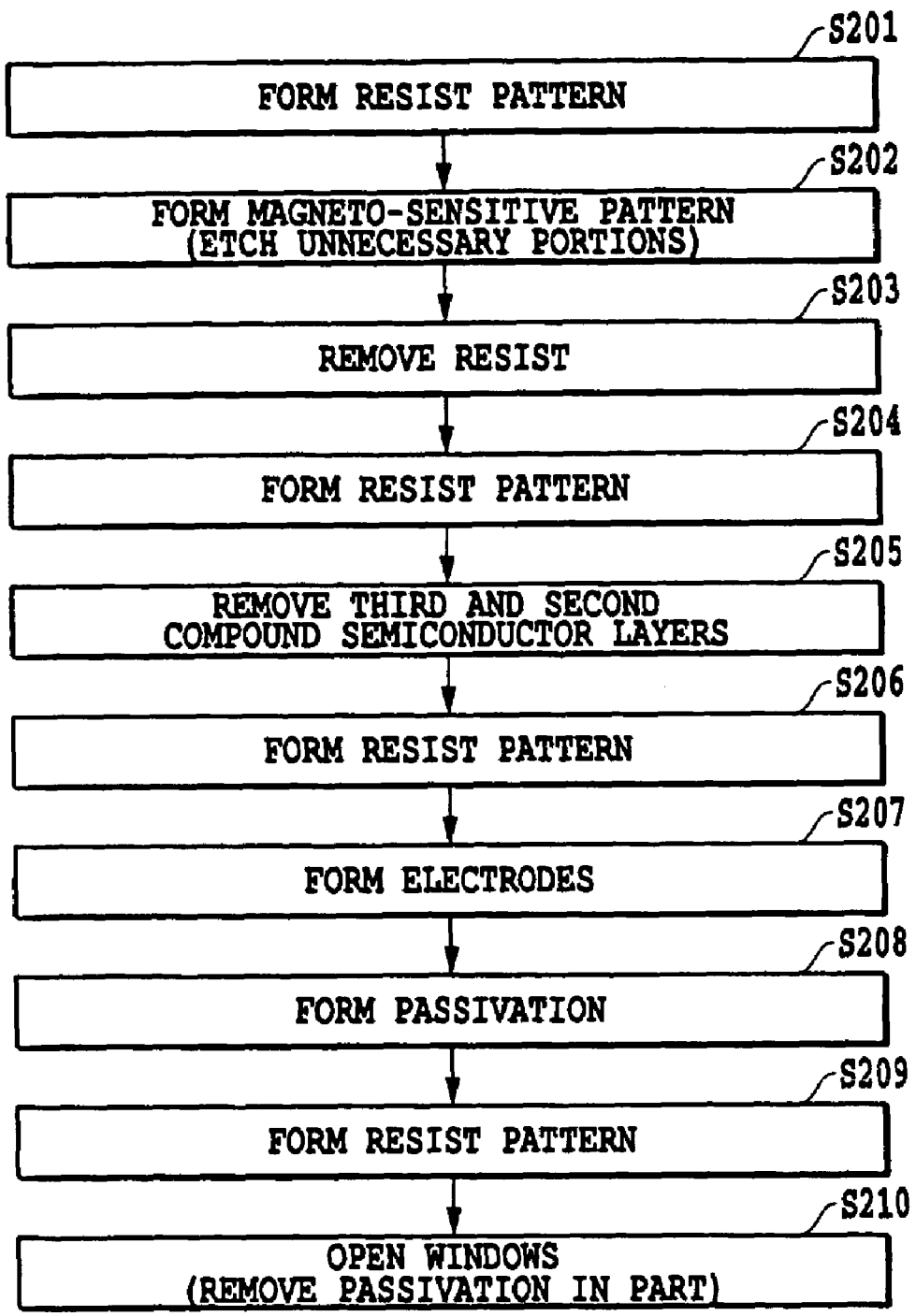
FIG. 2 is a diagram illustrating a fabrication process of the compound semiconductor Hall device of FIG. 1.
Figure 20:
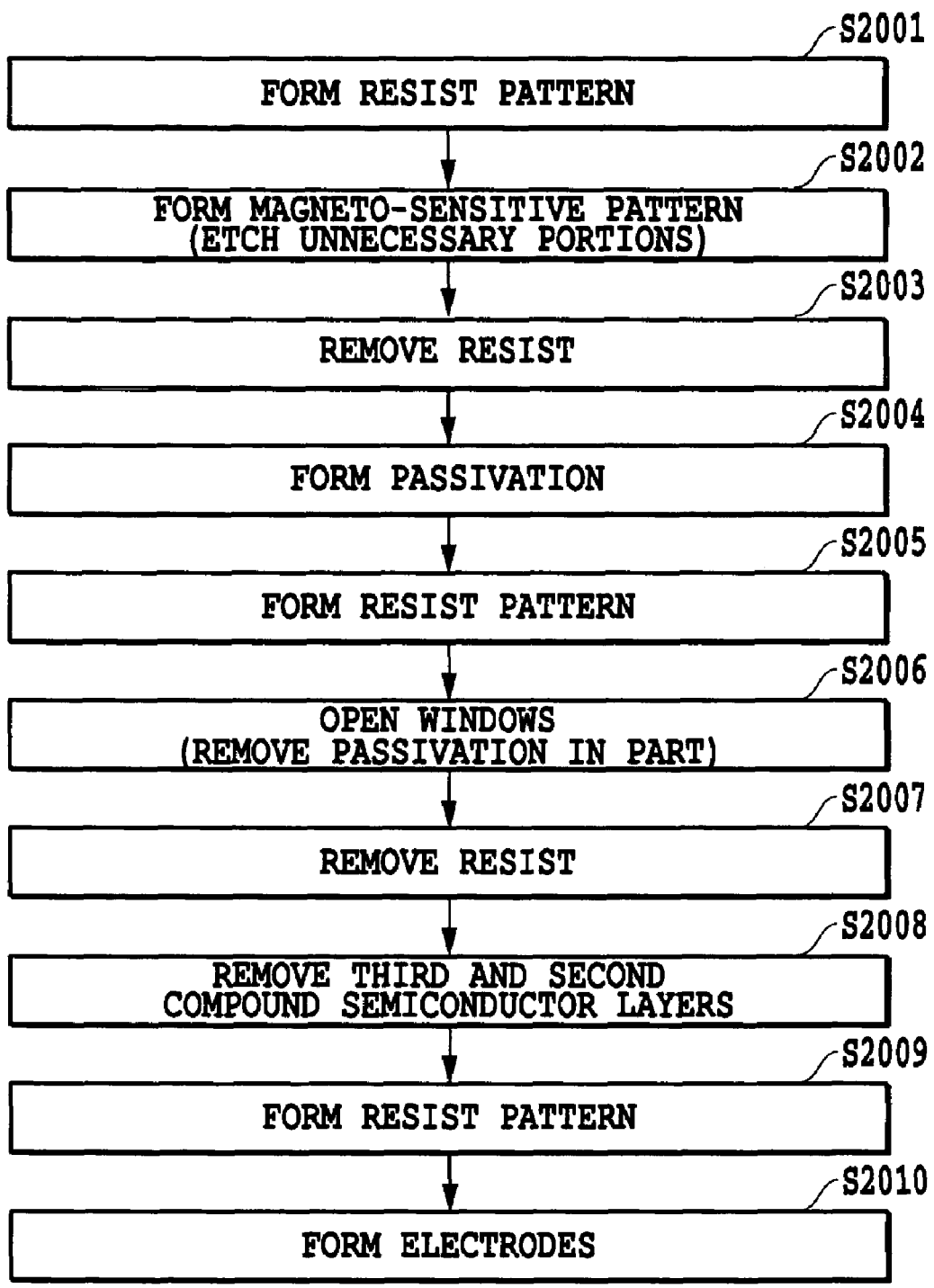
FIG. 20 is a flowchart illustrating a fabrication process of the compound semiconductor Hall device of FIG. 5.

| | mask for forming | | | | high temperature, high moisture test | soldering heat resistant test | |
|---|---|---|---|---|---|---|---|
| | third compound semiconductor (cap layer) | magneto-sensitive pattern | structure | process | ΔVu (mV) (standard deviation) | ΔVu (mV) (standard deviation) | ΔRin(%) (average) |
| Example 13 | $GaAs_{0.02}Sb_{0.98}$ | resist mask | FIG. 4 | FIG. 6 | 0.5 | 1.2 | 10 |
| comparative example 5 | $GaAs_{0.02}Sb_{0.98}$ | resist mask | FIG. 1 | FIG. 2 | 3.0 | 2.5 | 20 |
| comparative example 6 | $GaAs_{0.02}Sb_{0.98}$ | resist mask | FIG. 5 | FIG. 20 | 1.5 | 2.0 | 15 |
| Example 14 | GaAs | resist mask | FIG. 5 | FIG. 20 | 0.6 | 0.4 | 3 |
| Example 15 | GaAs | resist mask | FIG. 4 | FIG. 6 | 0.3 | 0.3 | 2 |
| Example 16 | $GaAs_{0.02}Sb_{0.98}$ | hard mask | FIG. 8 | FIG. 7 | 0.4 | 0.5 | 5 |
| Example 17 | GaAs | hard mask | FIG. 8 | FIG. 7 | 0.2 | 0.2 | 1 |
| Example 18 | $GaAs_{0.02}Sb_{0.98}$ | hard mask | FIG. 10 | FIG. 9 | 0.8 | 0.3 | 2 |
| Example 19 | $GaAs_{0.02}Sb_{0.98}$ | hard mask | FIG. 13 | FIG. 11 | 0.3 | 0.2 | 1 |
| Example 20 | $GaAs_{0.02}Sb_{0.98}$ | hard mask | FIG. 14 | FIG. 12 | 0.3 | 0.2 | 1 |
| Example 21 | GaAs | hard mask | FIG. 14 | FIG. 12 | 0.2 | 0.1 | 0 |

COMPARATIVE EXAMPLE 5

The Hall device as shown in FIG. 1 was fabricated by the following process.

The layer structure and fabrication process of the semiconductor thin film were the same as those of the example 13. The wafer process will be described with reference to the flowchart illustrated in FIG. 2. First, a resist pattern (including electrode contact portions) with a shape of the magneto-sensitive pattern was formed by the photolithography (S201). Using it as a mask, the magneto-sensitive pattern was formed by performing the mesa etching down to the GaAs substrate by ion milling (S202), followed by removing the resist (S203).

Subsequently, a resist pattern for exposing the InAs layer was formed using the photolithography (S204). Etching of unnecessary portions of the $GaAs_{0.02}Sb_{0.98}$ layer and $Al_{0.57}Ga_{0.43}As_{0.04}Sb_{0.96}$ layer was performed with HCl based etchant (S205), followed by removing the resist (S206). Since the etchant did not etch the InAs layer, the etching stopped on the surface of the InAs layer.

Subsequently, the 100 nm Ti layer and 600 nm Au layer were continuously evaporated by the vacuum evaporation method, and the pattern of the metal electrode layer was formed by the common lift off method (S207). After that, 300 nm $Si_3N_4$ was formed on the entire surface of the wafer as the passivation using plasma CVD (S208). On the $Si_3N_4$ layer, a resist pattern was formed having openings at the pad portions (S209). Then, unnecessary portions of the $Si_3N_4$ layer were etched by the reactive ion etching using the mixed gas of $CF_4$ and $O_2$ (S210). After removing the resist, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as the example 13. The measured results of 50 devices were evaluated in terms of the standard deviations for ΔVu, and in terms of the average values for ΔRin, and the results were illustrated in Table 14. Both the values were very large, and no sufficient reliability was achieved.

COMPARATIVE EXAMPLE 6

The Hall device as shown in FIG. 5 was fabricated by the following process.

The layer structure and fabrication process of the semiconductor thin film were the same as those of the example 13. The wafer process will be described with reference to the flowchart illustrated in FIG. 20. First, a resist pattern (including electrode contact portions) with a shape of the magneto-sensitive pattern was formed (S2001). Using it as a mask, the magneto-sensitive pattern was formed by performing the mesa etching down to the GaAs substrate by ion milling (S2002), followed by removing the resist (S2003).

Subsequently, 300 nm $Si_3N_4$ was formed on the entire surface of the wafer as the passivation using plasma CVD (S2004). On the $Si_3N_4$ layer, a resist pattern was formed having openings at the regions where the metal electrode layer makes contact with the InAs layer and at the pad portions (S2005). Then, unnecessary portions of the $Si_3N_4$ layer were etched by the reactive ion etching using the mixed gas of $CF_4$ and $O_2$ (S2006), followed by removing the resist (S2007).

Then, unnecessary portions of the $GaAs_{0.02}Sb_{0.98}$ layer and $Al_{0.57}Ga_{0.43}As_{0.04}Sb_{0.96}$ layer were etched with HCl based etchant (S2008) to expose the surface of the InAs layer that makes contact with the metal electrode layer. In addition, the 100 nm Ti layer and 600 nm Au layer were continuously evaporated by the vacuum evaporation method, and the pattern of the metal electrode layer was formed by the common lift off method (S2009 and S2010). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 µm long (length across the opposing electrodes) and 35 µm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations $\Delta Vu$ and the input resistance variations $\Delta Rin$ of the Hall device were measured under the same conditions as the example 11. The measured results of 50 devices were evaluated in terms of the standard deviations for $\Delta Vu$, and in terms of the average values for $\Delta Rin$, and the results were illustrated in Table 2. Both the values were very large, and no sufficient reliability was achieved.

EXAMPLE 14

The compound semiconductor Hall device as shown in FIG. 5 was fabricated by the following process.

First, the fabrication process of the semiconductor thin films will be described. The semiconductor thin films were formed by successively forming the following compound semiconductor layers on the GaAs substrate two inches in diameter by the molecular beam epitaxy (MBE): 500 nm $Al_{0.57}Ga_{0.43}As_{0.04}Sb_{0.96}$ as the first compound semiconductor layer; 50 nm InAs as the active layer; 50 nm $Al_{0.57}Ga_{0.43}As_{0.04}Sb_{0.96}$ as the second compound semiconductor layer; and 10 nm GaAs as the third compound semiconductor layer. The band gap of $Al_{0.57}Ga_{0.43}As_{0.04}Sb_{0.96}$ is about 1.2 eV, which is sufficiently greater than 0.36 eV of InAs. The electric characteristics of the semiconductor thin films were measured using the van der Pauw method. The results were: the electron mobility was 22000 cm$^2$/Vs, the sheet resistance was 380 $\Omega$, and the sheet electron concentration was $7.5 \times 10^{11}$ cm$^{-2}$.

Next, the wafer process will be described with reference to the flowchart of FIG. 20.

First, a resist pattern with a shape of the magneto-sensitive pattern (including electrode contact portions) was formed (S2001). Using it as a mask, the magneto-sensitive pattern was formed by performing the mesa etching down to the GaAs substrate by ion milling (S2002), followed by removing the resist (S2003).

Subsequently, 300 nm Si$_3$N$_4$ was formed on the entire surface of the wafer as the passivation using plasma CVD (S2004). On the Si$_3$N$_4$ layer, a resist pattern was formed having openings at the regions where the metal electrode layer makes contact with the InAs layer and at the pad portions (S2005). Then, unnecessary portions of the Si$_3$N$_4$ layer were etched by the reactive ion etching using the mixed gas of CF$_4$ and O$_2$ (S2006), followed by removing the resist (S2007).

Then, unnecessary portions of the GaAs layer and $Al_{0.57}Ga_{0.43}As_{0.04}Sb_{0.96}$ layer were etched by the ion milling, and the residual $Al_{0.57}Ga_{0.43}As_{0.04}Sb_{0.96}$ layer was etched with HCl based etchant to expose the surface of the InAs layer that makes contact with the metal electrode layer (S2008). In addition, the 100 nm Ti layer and 600 nm Au layer were continuously evaporated by the vacuum evaporation method, and the pattern of the metal electrode layer was formed by the common lift off method (S2009 and S2010). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 µm long (length across the opposing electrodes) and 35 µm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations $\Delta Vu$ and the input resistance variations $\Delta Rin$ of the Hall device were measured under the same conditions as in the example 13. The measured results of 50 devices were evaluated in terms of the standard deviations for $\Delta Vu$, and in terms of the average values for $\Delta Rin$, and the results were illustrated in Table 14. Both the values are smaller than those of the comparative example 6 in which the third compound semiconductor layer is composed of GaAsSb. In particular, improvement in the soldering heat resistant test was remarkable.

EXAMPLE 15

The process of fabricating the Hall device as shown in FIG. 4 having the semiconductor thin films of the same layer structure as those of the example 14 will be described.

The fabrication process of the semiconductor thin films is the same as that of the example 14. The wafer process was performed based on the flowchart of FIG. 6. First, a resist pattern with a shape of the magneto-sensitive pattern (including electrode contact portions) was formed (S601). Using it as a mask, the magneto-sensitive pattern was formed by performing the mesa etching down to the GaAs substrate by ion milling (S602), followed by removing the resist (S603).

Subsequently, a resist pattern having openings slightly greater than the regions at which the metal electrode layer makes contact with the InAs layer was formed on the semiconductor thin film (S604). Then, unnecessary portions of the GaAs layer and part of the $Al_{0.57}Ga_{0.43}As_{0.04}Sb_{0.96}$ layer were etched by the ion milling, and the residual $Al_{0.57}Ga_{0.43}As_{0.04}Sb_{0.96}$ layer was etched with HCl based etchant (S605) to expose the InAs surface making contact with the metal electrode layer (S605 and S606).

Subsequently, 300 nm Si$_3$N$_4$ was formed on the entire surface of the wafer as the passivation using plasma CVD (S607). On the Si$_3$N$_4$ layer, a resist pattern was formed having openings at the regions where the metal electrode layer makes contact with the InAs layer and at the pad portions (S608). Then, unnecessary portions of the Si$_3$N$_4$ layer were etched by the reactive ion etching using the mixed gas of CF$_4$ and O$_2$ (S609). Subsequently, the resist was removed (S610), followed by continuous evaporation of the 100 nm Ti layer and 600 nm Au layer by the vacuum evaporation method, and the pattern of the metal electrode layer was formed by the common lift off method (S611 and S612). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 µm long (length across the opposing electrodes) and 35 µm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as in the example 13. The measured results of 50 devices were evaluated in terms of the standard deviations for ΔVu, and in terms of the average values for ΔRin, and the results were illustrated in Table 14. Both the values are much smaller than those of the comparative example, which indicated that the improvement was remarkable.

EXAMPLE 16

The process of fabricating the Hall device as shown in FIG. 8 having the semiconductor thin films of the same layer structure as those of the example 13 will be described.

The fabrication process of the semiconductor thin films is the same as that of the example 13. The wafer process was performed based on the flowchart of FIG. 7. First, a resist pattern having openings slightly greater than the regions at which the metal electrode layer makes contact with the InAs layer was formed on the semiconductor thin film (S701). Then, unnecessary portions of the $GaAs_{0.02}Sb_{0.98}$ layer and the $Al_{0.57}Ga_{0.43}As_{0.04}Sb_{0.96}$ layer were etched with the HCl based etchant to expose the InAs surface making contact with the metal electrode layer (S702 and S703).

Subsequently, a 500 nm $SiO_2$ was formed on the entire surface of a wafer as the first passivation using the plasma CVD (S704). Subsequently, a resist pattern with a shape of the magneto-sensitive pattern (including electrode contact portions) was formed. Then, unnecessary portions of the $SiO_2$ layer were etched by the reactive ion etching using the mixed gas of $CF_4$ and $O_2$. Subsequently, a hard mask was formed by removing the resist (S706). Using the hard mask, the magneto-sensitive pattern was formed by performing the mesa etching down to the GaAs substrate by ion milling (S707 and S708). During the etching of the semiconductor thin films by the ion milling, the $SiO_2$ layer of the hard mask was also etched, leaving a film with a thickness of about 100 nm.

Subsequently, 300 nm $Si_3N_4$ was formed on the entire surface of the wafer as the second passivation using plasma CVD (S709). On the $Si_3N_4$ layer, a resist pattern was formed having openings at the regions where the metal electrode layer makes contact with the InAs layer and at the pad portions (S710). Then, unnecessary portions of the $Si_3N_4$ layer and $SiO_2$ layer were etched by the reactive ion etching using the mixed gas of $CF_4$ and $O_2$ (S711), followed by removing the resist (S712).

Furthermore, the 100 nm Ti layer and 600 nm Au layer were continuously evaporated by the vacuum evaporation method, and the pattern of the metal electrode layer was formed by the common lift off method (S713 and S714). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as in the example 13. The measured results of 50 devices were evaluated in terms of the standard deviations for ΔVu, and in terms of the average values for ΔRin, and the results were illustrated in Table 14. Both the values are much smaller than those of the comparative example, which indicated that the improvement was remarkable.

EXAMPLE 17

The process of fabricating the Hall device as shown in FIG. 8 having the semiconductor thin films of the same layer structure as those of the example 14 will be described.

The fabrication process of the semiconductor thin films is the same as that of the example 14. The wafer process was performed based on the flowchart of FIG. 7. First, a resist pattern having openings slightly greater than the regions at which the metal electrode layer makes contact with the InAs layer was formed on the semiconductor thin films (S701). Then, unnecessary portions of the GaAs layer and part of the $Al_{0.57}Ga_{0.43}As_{0.04}Sb_{0.96}$ layer were etched by the ion milling, and the residual $Al_{0.57}Ga_{0.43}As_{0.04}Sb_{0.96}$ layer 44 was etched by the HCl based etchant to expose the InAs surface making contact with the metal electrode layer (S702 and S703).

Subsequently, a 500 nm $SiO_2$ was formed on the entire surface of a wafer as the first passivation using the plasma CVD (S704). Subsequently, a resist pattern with a shape of the magneto-sensitive pattern (including electrode contact portions) was formed (S705). Then, unnecessary portions of the $SiO_2$ layer were etched by the reactive ion etching using the mixed gas of $CF_4$ and $O_2$. Subsequently, a hard mask was formed by removing the resist (S706). Using the hard mask, the magneto-sensitive pattern was formed by performing the mesa etching down to the GaAs substrate by ion milling (S707 and S708). During the etching of the semiconductor thin films by the ion milling, the $SiO_2$ layer of the hard mask was also etched, leaving a film with a thickness of about 100 nm.

Subsequently, 300 nm $Si_3N_4$ was formed on the entire surface of the wafer as the second passivation using plasma CVD (S709). On the $Si_3N_4$ layer, a resist pattern was formed having openings at the regions where the metal electrode layer makes contact with the InAs layer and at the pad portions (S710). Then, unnecessary portions of the $Si_3N_4$ layer and $SiO_2$ layer were etched by the reactive ion etching using the mixed gas of $CF_4$ and $O_2$ (S711), followed by removing the resist (S712).

Furthermore, the 100 nm Ti layer and 600 nm Au layer were continuously evaporated by the vacuum evaporation method, and the pattern of the metal electrode layer was formed by the common lift off method (S713 and S714). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as in the example 13. The measured results of 50 devices were evaluated in terms of the standard deviations for ΔVu, and in terms of the average values for ΔRin, and the results were illustrated in Table 14. Both the values are much smaller than those of the comparative example, which indicated that the improvement was remarkable.

EXAMPLE 18

The process of fabricating the Hall device as shown in FIG. 10 having the semiconductor thin films of the same layer structure as those of the example 13 will be described.

The fabrication process of the semiconductor thin films is the same as that of the example 13. The wafer process was performed based on the flowchart of FIG. 9. First, a 500 nm $SiO_2$ was formed on the entire surface of a wafer as the first passivation using the plasma CVD (S901). Subsequently, a resist pattern with a shape of the magneto-sensitive pattern (including electrode contact portions) was formed (S902). Then, unnecessary portions of the $SiO_2$ layer were etched by the reactive ion etching using the mixed gas of $CF_4$ and $O_2$, and a hard mask was formed by removing the resist (S903). Using the hard mask, the magneto-sensitive pattern was formed by performing the mesa etching down to the GaAs substrate by ion milling (S904 and S905). During the etching of the semiconductor thin films by the ion milling, the $SiO_2$ layer of the hard mask was also etched, leaving a film with a thickness of about 100 nm.

Subsequently, 300 nm $Si_3N_4$ was formed on the entire surface of the wafer as the second passivation using plasma CVD (S906). On the $Si_3N_4$ layer, a resist pattern was formed having openings at the regions where the metal electrode layer makes contact with the InAs layer and at the pad portions (S907). Then, unnecessary portions of the $Si_3N_4$ layer and $SiO_2$ layer were etched by the reactive ion etching using the mixed gas of $CF_4$ and $O_2$ (S908), followed by removing the resist (S909). Then, unnecessary portions of the $GaAs_{0.02}Sb_{0.98}$ layer and $Al_{0.57}Ga_{0.43}As_{0.04}Sb_{0.96}$ layer were etched by the HCl based etchant to expose the InAs surface making contact with the metal electrode layer (S910).

Furthermore, the 100 nm Ti layer and 600 nm Au layer were continuously evaporated by the vacuum evaporation method, and the pattern of the metal electrode layer was formed by the common lift off method (S911 and S912). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as in the example 13. The measured results of 50 devices were evaluated in terms of the standard deviations for ΔVu, and in terms of the average values for ΔRin, and the results were illustrated in Table 14. Both the values are much smaller than those of the comparative example, which indicated that the improvement was remarkable.

EXAMPLE 19

The process of fabricating the Hall device as shown in FIG. 13 having the semiconductor thin films of the same layer structure as those of the example 13 will be described.

The fabrication process of the semiconductor thin films is the same as that of the example 13. The wafer process was performed based on the flowchart of FIG. 11. First, a 500 nm $SiO_2$ was formed on the entire surface of a wafer as the first passivation using the plasma CVD (S1101). Subsequently, a resist pattern with a shape of the magneto-sensitive pattern (including electrode contact portions) was formed (S1102). Then, unnecessary portions of the $SiO_2$ layer were etched by the reactive ion etching using the mixed gas of $CF_4$ and $O_2$, and a hard mask was formed by removing the resist (S1103). Using the hard mask, the magneto-sensitive pattern was formed by performing the mesa etching down to the GaAs substrate by ion milling (S1104 and S1105). During the etching of the semiconductor thin films by the ion milling, the $SiO_2$ layer of the hard mask was also etched, leaving a film with a thickness of about 100 nm.

Subsequently, a resist pattern having openings slightly greater than the regions at which the metal electrode layer makes contact with the InAs layer was formed on the $SiO_2$ layer (S1106). Then, unnecessary portions of the $SiO_2$ layer were etched by the reactive ion etching using the mixed gas of $CF_4$ and $O_2$ (S1107), followed by removing the resist (S1108). After that, unnecessary portions of the $GaAs_{0.02}Sb_{0.98}$ layer and $Al_{0.57}Ga_{0.43}As_{0.04}Sb_{0.96}$ layer were etched by the HCl based etchant to expose the InAs surface making contact with the metal electrode layer (S1109).

Subsequently, 300 nm $Si_3N_4$ was formed on the entire surface of the wafer as the second passivation using plasma CVD (S1110). On the $Si_3N_4$ layer, a resist pattern was formed having openings at the regions where the metal electrode layer makes contact with the InAs layer and at the pad portions (S1111). Then, unnecessary portions of the $Si_3N_4$ layer and S102 layer were etched by the reactive ion etching using the mixed gas of $CF_4$ and $O_2$ (S1112), followed by removing the resist (S1113).

Furthermore, the 100 nm Ti layer and 600 nm Au layer were continuously evaporated by the vacuum evaporation method, and the pattern of the metal electrode layer was formed by the common lift off method (S1114 and S1115). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as in the example 13. The measured results of 50 devices were evaluated in terms of the standard deviations for ΔVu, and in terms of the average values for ΔRin, and the results were illustrated in Table 14. Both the values are much smaller than those of the comparative example, which indicated that the improvement was remarkable.

EXAMPLE 20

The process of fabricating the Hall device as shown in FIG. 14 having the semiconductor thin films of the same layer structure as those of the example 13 will be described.

The fabrication process of the semiconductor thin films is the same as that of the example 13. The wafer process was performed based on the flowchart of FIG. 12. First, a 500 nm $SiO_2$ was formed on the entire surface of a wafer as the first passivation using the plasma CVD (S1201). Subsequently, a resist pattern with a shape of the magneto-sensitive pattern (including electrode contact portions) was formed (S1202). Then, unnecessary portions of the $SiO_2$ layer were etched by the reactive ion etching using the mixed gas of $CF_4$ and $O_2$, and a hard mask was formed by removing the resist (S1203). Using the hard mask, the magneto-sensitive pattern was formed by performing the mesa etching down to the GaAs substrate by ion milling (S1204 and S1205). During the etching of the semiconductor thin films by the ion milling, the $SiO_2$ layer of the hard mask was also etched, leaving a film with a thickness of about 100 nm.

Subsequently, 100 nm $Si_3N_4$ was formed on the entire surface of the wafer as the second passivation using plasma CVD (S1206). On the $Si_3N_4$ layer, a resist pattern was formed having openings at the regions where the metal electrode layer makes contact with the InAs layer and at the pad portions (S1207). Then, unnecessary portions of the $Si_3N_4$ layer and $SiO_2$ layer were etched by the reactive ion etching using the mixed gas of $CF_4$ and $O_2$ (S1208), followed by removing the resist (S1209). Then, unnecessary portions of the $GaAs_{0.02}Sb_{0.98}$ layer and $Al_{0.57}Ga_{0.43}As_{0.04}Sb_{0.96}$ layer were etched by the HCl based etchant to expose the InAs surface making contact with the metal electrode layer (S1210).

Subsequently, 200 nm $Si_3N_4$ was formed on the entire surface of the wafer as the third passivation using plasma CVD (S1211). On the $Si_3N_4$ layer, a resist pattern was formed having openings at the regions where the metal electrode layer makes contact with the InAs layer and at the pad portions (S1212). Then, unnecessary portions of the $Si_3N_4$ layer were etched by the reactive ion etching using the mixed gas of $CF_4$ and $O_2$, followed by removing the resist (S1213).

Furthermore, the 100 nm Ti layer and 600 nm Au layer were continuously evaporated by the vacuum evaporation method, and the pattern of the metal electrode layer was formed by the common lift off method (S1214 and S1215). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, diebonding, wirebonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as in the example 13. The measured results of 50 devices were evaluated in terms of the standard deviations for ΔVu, and in terms of the average values for ΔRin, and the results were illustrated in Table 14. Both the values are much smaller than those of the comparative example, which indicated that the improvement was remarkable.

EXAMPLE 21

The process of fabricating the Hall device as shown in FIG. 14 having the semiconductor thin films of the same layer structure as those of the example 14 will be described.

The fabrication process of the semiconductor thin films is the same as that of the example 14. The wafer process was performed based on the flowchart of FIG. 12. First, a 500 nm $SiO_2$ was formed on the entire surface of a wafer as the first passivation using the plasma CVD (S1201). Subsequently, a resist pattern with a shape of the magneto-sensitive pattern (including electrode contact portions) was formed (S1202). Then, unnecessary portions of the $SiO_2$ layer were etched by the reactive ion etching using the mixed gas of $CF_4$ and $O_2$, and a hard mask was formed by removing the resist (S1203). Using the hard mask, the magneto-sensitive pattern was formed by performing the mesa etching down to the GaAs substrate by ion milling (S1204 and S1205). During the etching of the semiconductor thin films by the ion milling, the $SiO_2$ layer of the hard mask was also etched, leaving a film with a thickness of about 100 nm.

Subsequently, 100 nm $Si_3N_4$ was formed on the entire surface of the wafer as the second passivation using plasma CVD (S1206). On the $Si_3N_4$ layer, a resist pattern was formed having openings at the regions where the metal electrode layer makes contact with the InAs layer and at the pad portions (S1207). Then, unnecessary portions of the $Si_3N_4$ layer and $SiO_2$ layer were etched by the reactive ion etching using the mixed gas of $CF_4$ and $O_2$ (S1208), followed by removing the resist (S1209). Subsequently, unnecessary portions of the GaAs layer and part of the $Al_{0.57}Ga_{0.43}As_{0.04}Sb_{0.96}$ layer were etched by the ion milling, and the residual $Al_{0.57}Ga_{0.43}As_{0.04}Sb_{0.96}$ layer was etched by the HCl based etchant to expose the InAs surface making contact with the metal electrode layer (S1210).

Subsequently, 200 nm $Si_3N_4$ was formed on the entire surface of the wafer as the third passivation using plasma CVD (S1211). On the $Si_3N_4$ layer, a resist pattern was formed having openings at the regions where the metal electrode layer makes contact with the InAs layer and at the pad portions (S1212). Then, unnecessary portions of the $Si_3N_4$ layer were etched by the reactive ion etching using the mixed gas of $CF_4$ and $O_2$ (S1213), followed by removing the resist.

Furthermore, the 100 nm Ti layer and 600 nm Au layer were continuously evaporated by the vacuum evaporation method, and the pattern of the metal electrode layer was formed by the common lift off method (S1214 and S1215). Finally, the wafer was subjected to 250° C., two hour annealing in an Ar atmosphere, thereby fabricating the compound semiconductor Hall devices.

A lot of compound semiconductor Hall devices fabricated on the wafer by the foregoing method each have the magneto-sensitive pattern of 95 μm long (length across the opposing electrodes) and 35 μm wide. The Hall devices were subjected to dicing, die bonding, wire bonding, and transfer mold, and thus the Hall devices molded by an epoxy resin were fabricated.

The sensitivity of the Hall device fabricated by the foregoing method was measured in the magnetic field of 50 mT by applying the input voltage of 3 V, resulting in the output voltage of 120 mV. In addition, the unbalanced voltage variations ΔVu and the input resistance variations ΔRin of the Hall device were measured under the same conditions as in the example 13. The measured results of 50 devices were evaluated in terms of the standard deviations for ΔVu, and in terms of the average values for ΔRin, and the results were illustrated in Table 14. Both the values are much smaller than those of the comparative example, which indicated that the improvement was remarkable.

EXAMPLE 22

A simple model of a pointing device using the Hall device was fabricated.

Figure 21:
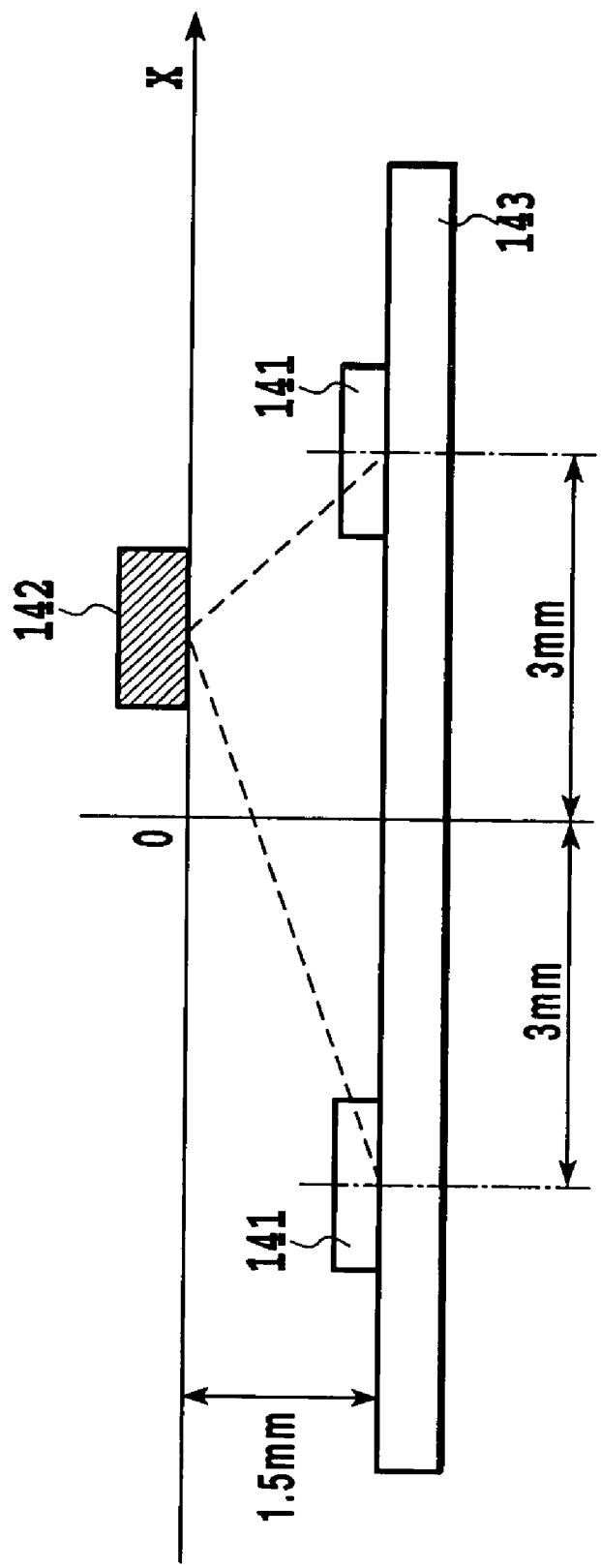
FIG. 21 is a schematic diagram of a pointing device using the Hall device.

FIG. 21 is a schematic diagram of the simple pointing device using the Hall device. In FIG. 21, each reference numeral 141 designates a Hall device, and the reference numeral 142 designates a ferrite magnet, and 143 designates a printed circuit board.

As shown in FIG. 21, the two Hall devices 141 and 141 are placed 6 mm apart on the printed circuit board 143, and the ferrite magnet 142 was fixed at the height of 1.5 mm from the printed circuit board 143. The ferrite magnet 142 can be moved on the line which links the two Hall devices 141 and 141 and is parallel with the printed circuit board 143. The X axis is set on the line, and the origin is set at the position of the ferrite magnet 142 when the distances between the ferrite magnet 142 and the two Hall devices 141 and 141 are equal. In this case, the position of the ferrite magnet 142 can be obtained from the output difference between the two Hall devices 141 and 141.

Measurements were carried out when the Hall devices had the magneto-sensitive pattern of the InAs multilayer film structure, and of GaAs.

Figure 22:
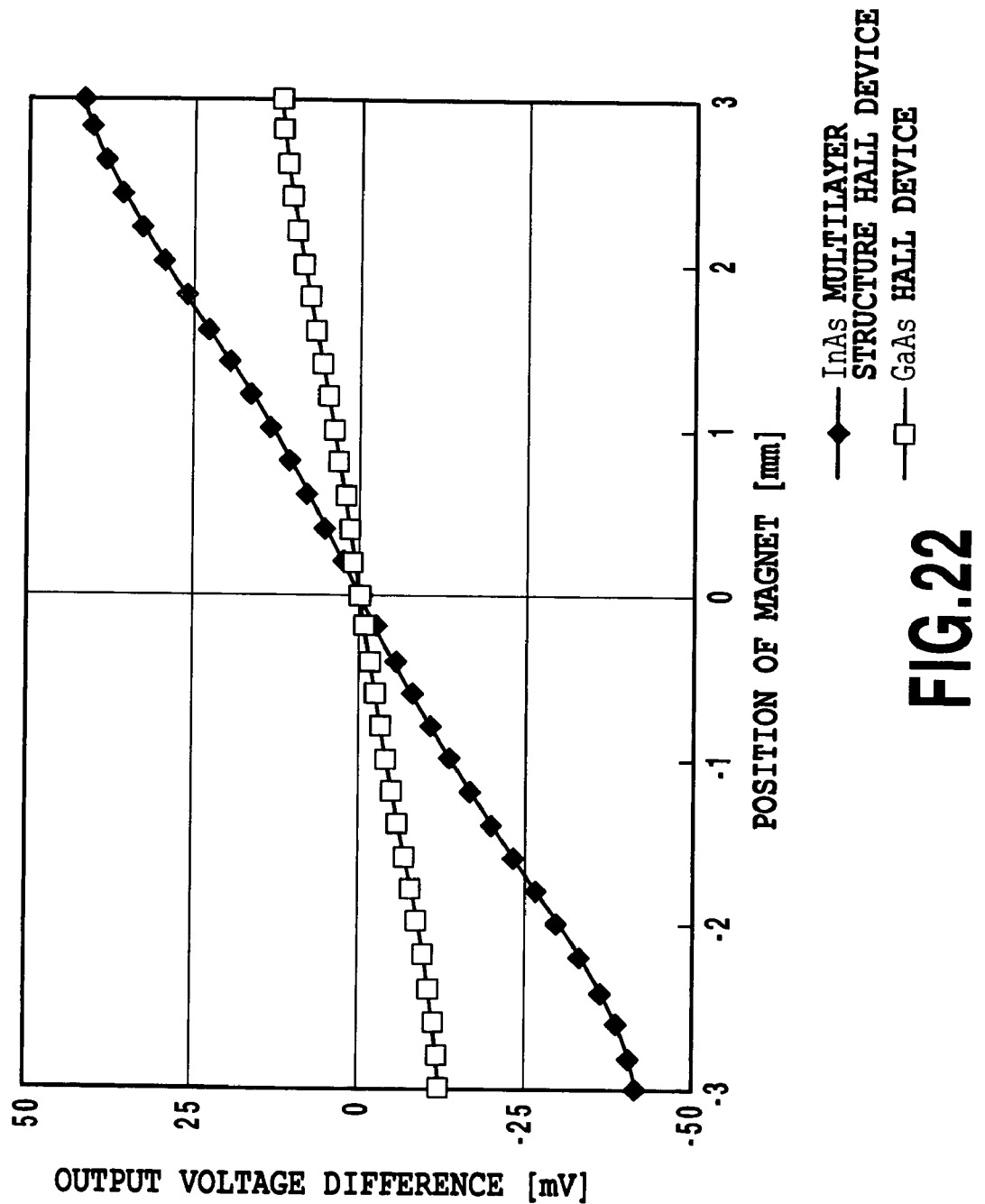
FIG. 22 is a graph illustrating measured results of the output voltage differences of two Hall devices according to the position of a ferrite magnet.

FIG. 22 is a graph illustrating measured results of the output differences of the two Hall devices depending on the position of the ferrite magnet.

The value of the input resistance R×sensitivity Vh is 35 [Ω·V] in the Hall device with the InAs multilayer structure, and 8 [Ω·V] in the Hall device with the GaAs. The device with the InAs multilayer structure had the input resistance of 950 Ω, and the sensitivity of 37 mV (for 1V input and 50 mT), and the Hall device with the GaAs had the input resistance of 750 Ω, and the sensitivity of 11 mV (for 1V input and 50 mT), and the input voltage was set at 5 V, each.

The Hall device with the InAs multilayer structure, which has a greater resistance than the GaAs Hall device, can produce much greater output difference. This indicates that the Hall device with the InAs multilayer structure is advantageous over the GaAs Hall device in both the power consumption and sensitivity.

Figure 23:
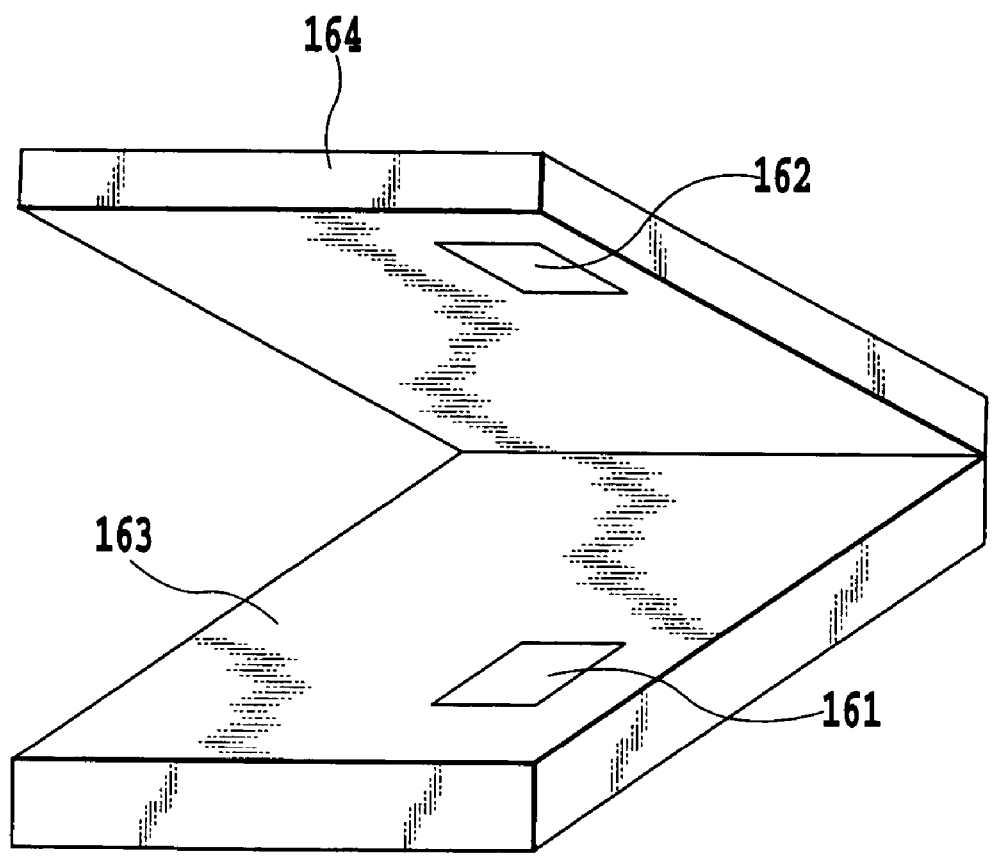
FIG. 23 is a perspective view showing an example of an open/close detection switch using the Hall device for mobile equipment.

Using the foregoing Hall devices, an open/close detection switch for the mobile equipment application purpose can be fabricated. FIG. 23 is a perspective view showing an example of the open/close detection switch for the mobile equipment application purpose using the Hall device. In FIG. 23, the reference numeral 161 designates a Hall device, 162 designates a magnet, 163 designates a body of the mobile equipment, and 164 designates a flap of the mobile equipment. The Hall device 161 and the magnet 162 are placed at an opposing position so that they operate as a switching mechanism as they approach or separate from each other.

Figure 24:
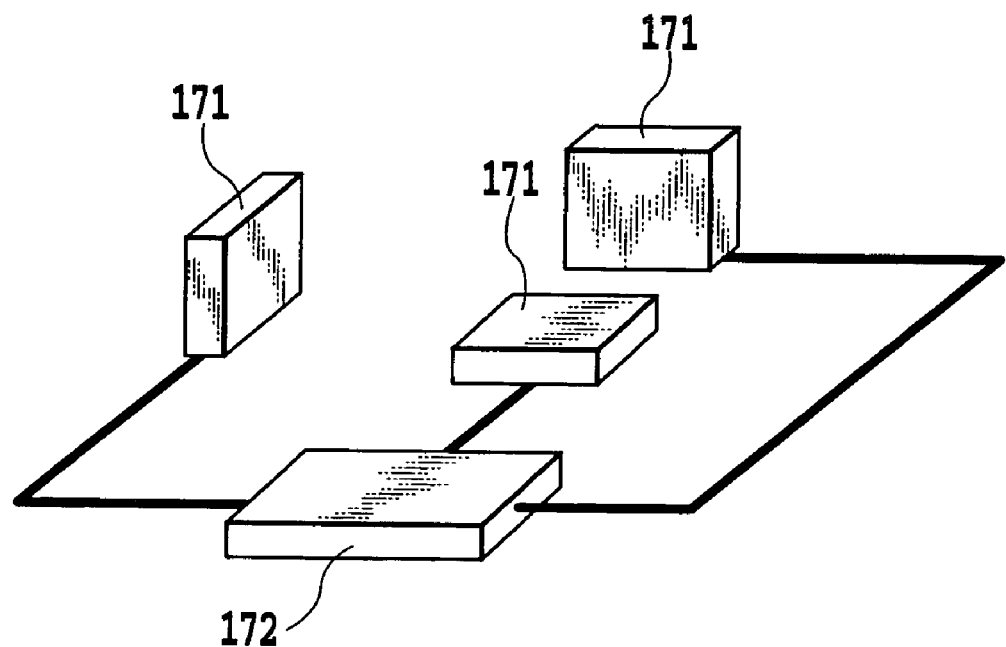
FIG. 24 is a perspective view showing an example of a geomagnetic direction sensor using the Hall device for mobile equipment.

In addition, the foregoing Hall devices are applicable to fabricating a geomagnetic direction sensor for the mobile equipment application purpose. FIG. 24 is a perspective view showing an example of the geomagnetic direction sensor for the mobile equipment application purpose using the Hall device. In FIG. 24, each reference numeral 171 designates a Hall device, and the reference numeral 172 designates a control IC. The geomagnetic direction sensor is configured such that the X, Y and Z directions of the geomagnetism are detected by the Hall devices 171.

Incidentally, the open/close detection switch and the geomagnetic direction sensor of FIGS. 23 and 24 show only an example, and it is obvious that other application examples are conceivable without being limited to these configurations.

In addition, it is also possible to fabricate the mobile equipment by incorporating the foregoing pointing device, open/close detection switch, and geomagnetic direction sensor for the mobile equipment application purpose.

INDUSTRIAL APPLICABILITY

A Hall device includes semiconductor thin films including an active layer composed of $In_{X1}Ga_{1-X1}As_{Y1}Sb_{1-Y1}$ ($0 \leq X1 \leq 1$, $0 \leq Y1 \leq 1$), and compound semiconductor layers that are formed on and under the active layer, and that each have a band gap greater than that of the active layer; a metal electrode layer; and a passivation, wherein the metal electrode layer makes contact with the semiconductor thin films only with the active layer, and top surfaces and side surfaces of the semiconductor thin films other than the contact surface are directly covered with the passivation. Thus, the compound semiconductor layers placed on and under the active layer and having the greater band gap have their entire surfaces (top surface and side surfaces) covered with the passivation, and the metal electrode layer makes contact with only the active layer without making contact with the compound semiconductor layers, thereby implementing a device structure in which current flows through the active layer stably. As a result, a compound semiconductor Hall device with small Vu+rVu variations can be provided.

In particular, as to the Hall device having the semiconductor thin films including an active layer composed of $In_{X1}Ga_{1-X1}As_{Y1}Sb_{1-Y1}$ ($0 \leq X1 \leq 1$, $0 \leq Y1 \leq 1$), and compound semiconductor layers that are formed on and under said active layer, and that each include Sb having a band gap greater than that of said active layer, the metal electrode layer makes contact with the semiconductor thin films only with the active layer, and all the top surface and side surfaces of the semiconductor thin films other than the contact surface are directly covered with the passivation. Thus, the structure is implemented in which the compound semiconductor layers placed on and under the active layer and having the greater band gap have their entire surfaces (top surface and side surfaces) covered with the passivation. As a result, the compound semiconductor Hall device can be provided which has small variations in device characteristics and high reliability, and particularly in a high temperature, high moisture environment.

In addition, a compound semiconductor stacked structure has first and second compound semiconductor layers each composed of Sb and at least two of five elements consisting of Al, Ga, In, As and P, and an active layer consisting of a multinary compound semiconductor with a composition represented by $In_xGa_{1-x}As_ySb_{1-y}$ (0.8≦x≦1.0, 0.8≦y≦1.0), which layers are stacked, and the lattice constant differences between the active layer and the first and second compound semiconductor layers are set within a range of 0.0 to 1.2%, and the active layer is made thicker than 30 nm and thinner than 100 nm. This enables improvement of the reproducibility of controlling the physical properties of the quantum well compound semiconductor stacked structure, thereby being able to provide an industrially producible, highly sensitive, low power consumption, excellent temperature characteristic Hall device by enabling stable provision of a quantum well compound semiconductor stacked structure having high electron mobility and sheet resistance, and excellent temperature characteristics.

Furthermore, the Hall device is configured such that it includes a magneto-sensitive pattern with a multilayer structure that includes an active layer formed on a substrate and composed of an $In_xGa_{1-x}As_ySb_{1-y}$ (0≦x1≦1, 0≦y≦1) layer greater than 30 nm and less than 100 nm in film thickness, and compound semiconductors sandwiching the active layer, wherein the input resistance R×sensitivity Vh is equal to or greater than 20 [Ω·V] under conditions that an input voltage is 1 V, and applied magnetic field is 50 mT. The Hall device can facilitate the device design for the mobile equipment using the Hall device as compared with the conventional devices.

What is claimed is:

1. A compound semiconductor stacked structure having a first compound semiconductor layer, an active layer, and a second compound semiconductor layer, which are successively stacked on a substrate, wherein
    said active layer consists of a compound semiconductor with a composition represented by $In_xGa_{1-x}As_ySb_{1-y}$ (0.8≦x≦1.0, 0.8≦y≦1.0) and is thicker than 35 nm and thinner than 70 nm;
    said first and second compound semiconductor layers are each a compound semiconductor layer having Sb and at least two of five elements consisting of Al, Ga, In, As and P, and have a band gap greater than that of said active layer, and a resistance at least five times greater than that of said active layer; and
    lattice constant differences between said active layer and said first and second compound semiconductor layers are set within a range of 0.2% to 0.9%.

2. The compound semiconductor stacked structure as claimed in claim 1, further comprising a third compound semiconductor layer that is represented by $In_wGa_{1-w}As$ (0≦w≦1), and stacked on said second compound semiconductor layer.

3. The compound semiconductor stacked structure as claimed in claim 1, wherein said active layer is InAs.

4. The compound semiconductor stacked structure as claimed in claim 1, wherein said first and second compound semiconductor layers are each composed of $Al_zGa_{1-z}As_ySb_{1-y}$ (0.0≦Z≦1.0, 0.0≦Y≦0.3).

5. A magnetic sensor comprising electrodes formed on said active layer of said compound semiconductor stacked structure as defined in claim 1.

6. Mobile equipment using the magnetic sensor as defined in claim 5.

7. The mobile equipment as claimed in claim 6, wherein said mobile equipment is a mobile phone.

8. A Hall device comprising:
    semiconductor thin films formed on a substrate including an active layer composed of $In_{x1}Ga_{1-x1}As_{y1}Sb_{1-y1}$ (0≦X1≦1, 0≦Y1≦1), and first and second compound semiconductor layers that are formed on and under said active layer, and that each of the first and second compound semiconductor layers having a band gap greater than that of said active layer;
    a passivation covered directly a top surface and side surfaces of said semiconductor thin films other than a part of said active layer; and
    a metal electrode layer formed on said passivation and the part on said active layer, electrically isolated from said first and second compound semiconductor layers by said passivation, and makes contact only with said active layer of said semiconductor thin films.

9. The Hall device as claimed in claim 8, wherein said compound semiconductor layers are each including Sb.

10. The Hall device as claimed in claim 9, wherein the compound semiconductor layer formed on said active layer has at least two layers, and a surface layer of them is composed of $In_{x2}Ga_{1-x2}As$ (0≦X2≦1).

11. The Hall device as claimed in claim 8, wherein said semiconductor thin films are formed on a substrate composed of GaAs or Si, said active layer is composed of InAs, and said compound semiconductor layers are each composed of $Al_{z1}Ga_{1-z1}As_{y2}Sb_{1-y2}$ (0≦Z1≦1, 0≦Y2≦0.3).

12. The Hall device as claimed in claim 8, wherein a magneto-sensitive pattern with a multilayer structure that includes said active layer formed on said substrate and composed of an $In_xGa_{1-x}As_ySb_{1-y}$ (0≦x≦1, 0≦y≦1) layer greater than 30 nm and less than 100 nm in film thickness, and compound semiconductors sandwiching the active layer, wherein input resistance R× sensitivity Vh is equal to or greater than 20 under conditions that an input voltage is 1 V, and applied magnetic field is 50 mT.

13. The Hall device as claimed in claim 12, wherein said active layer has its upper and lower layers composed of Sb and at least two of five elements of Al, Ga, In, As and P.

14. A pointing device using the Hall device as defined in claim 12.

15. An open/close detection switch using the Hall device as defined in claim 12.

16. A geomagnetic direction sensor using the Hall device as defined in claim 12.

* * * * *